US011935599B2

(12) United States Patent
Hsu et al.

(10) Patent No.: US 11,935,599 B2
(45) Date of Patent: Mar. 19, 2024

(54) BURST PROGRAMMING OF A NAND FLASH CELL

(71) Applicant: SanDisk Technologies LLC, Addison, TX (US)

(72) Inventors: Hua-Ling Cynthia Hsu, Fremont, CA (US); Fanglin Zhang, Fremont, CA (US); Victor Avila, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 126 days.

(21) Appl. No.: 17/725,911

(22) Filed: Apr. 21, 2022

(65) Prior Publication Data

US 2023/0343397 A1 Oct. 26, 2023

(51) Int. Cl.

*G11C 16/10* (2006.01)
*G11C 7/10* (2006.01)
*G11C 16/08* (2006.01)
*G11C 16/24* (2006.01)
*G11C 16/26* (2006.01)

(52) U.S. Cl.

CPC .......... *G11C 16/102* (2013.01); *G11C 7/1051* (2013.01); *G11C 16/08* (2013.01); *G11C 16/24* (2013.01); *G11C 16/26* (2013.01)

(58) Field of Classification Search

CPC ..... G11C 16/102; G11C 7/1051; G11C 16/08; G11C 16/24; G11C 16/26
USPC .................................................... 365/189.05
See application file for complete search history.

(56) References Cited

U.S. PATENT DOCUMENTS 5,982,697 A * 11/1999 Williams ............ G11C 11/4072 365/230.03
2010/0118592 A1* 5/2010 Ishihara ............ G11C 13/0069 365/189.011
2021/0357155 A1* 11/2021 You ....................... G06F 3/0634

* cited by examiner

*Primary Examiner* — Fernando Hidalgo
(74) *Attorney, Agent, or Firm* — Hector A. Agdeppa; SHEPPARD, MULLIN, RICHTER & HAMPTON LLP

(57) ABSTRACT

A fast burst program sequence that reduces overall NAND flash programming time is disclosed. The burst program sequence includes maintaining a charge pump in an ON state and not fully discharging the WL/BLs at the conclusion of the programming phase of each program operation. As a result, the fast burst program sequence provides total program time savings over an existing cache program sequence by eliminating the full WL/BL discharge and charge pump reset that conventionally occurs after each program operation, which in turn, allows for the transfer of next page data from the page buffer to the data latches to be hidden within the program time of a prior/current program operation.

20 Claims, 19 Drawing Sheets

| | Program data size | Cache SLC program | Burst SLC program | | | |
|---|---|---|---|---|---|---|
| Tprog(us) | | 62n+15 | 47n+30 | | 49.5n+27.5 | |
| Tprog(n=2) | 32KB | 139us | 124us | 11% reduction | 126.5us | 9% reduction |
| Tprog(n=10) | 160KB | 635us | 500us | 21% reduction | 522.5us | 18% reduction |
| Tprog(n=16) | 256KB | 1,007us | 782us | 22% reduction | 819.5us | 19% reduction |
| Tprog(n=128) | 2MB | 7,951us | 6,046us | 24% reduction | 6,363.5us | 20% reduction |

FIG. 8

BURST PROGRAMMING OF A NAND FLASH CELL

BACKGROUND

Flash memory is an electronic, non-volatile computer memory storage medium that can be electrically erased and reprogrammed. Flash memory is widely used across a range of products and industries including computers, mobile phones, tablet devices, personal digital assistants (PDAs), digital audio players, digital cameras, video games, scientific instrumentation, industrial robotics, and medical electronics, to name a few. NAND flash memory—one of the two primary types of flash memory—can be found in memory cards, USB flash drives, solid-state drives, smartphones, and the like. NAND flash may employ floating gate transistors (e.g., floating gate metal-oxide-semiconductor field-effect transistors (MOSFETs)) or charge trapping layer (CTL) transistors, connected in a manner that resembles a NAND logic gate.

Various types of NAND flash technology are available that differ in the number of programmed states that can be achieved for a NAND flash cell, and thus, the number of bits of information that can be stored in a single cell. In single-level cell (SLC) NAND flash technology, for instance, each memory cell stores 1 bit of information by virtue of being in one of two possible states—an erase state or a programmed state. In multi-level cell (MLC) NAND flash technology, each memory cell stores 2 bits of information, which corresponds to three programmed states and one erase state. Along similar lines, in triple-level cell (TLC) flash technology, each flash memory cell stores three bits of information, which in turn, corresponds to seven programmed states and one erase state, and so on for higher-cell flash technologies, and in quad-level cell (QLC) flash technology, each cell stores four bits of information, which corresponds to fifteen programmed states and one erase state.

A NAND flash memory cell is set (programmed) and reset (erased) by applying or removing charge from a floating gate (FG) or charge trapping layer (CTL) of the cell. Fowler-Nordheim (FN) tunneling or hot carrier injection (HCI) techniques may be employed to apply or remove charge. When charge is applied to or removed from a FG transistor or CTL transistor of a flash memory cell, the threshold voltage of the transistor changes. This change in threshold voltage is what allows the flash memory cell to be used as a memory storage device. That is, information is stored in the flash memory cell as the threshold voltage of the underlying transistor of the cell.

To program or erase a flash memory cell, a set of programming pulses are applied to cause the threshold voltage of the cell's transistor to change to one of the possible threshold voltage values that the transistor can attain, and thus, to place the cell in a corresponding one of the possible programmable states. The number of programming pulses needed may depend on whether the cell is a single-bit cell of a multi-bit cell. Reducing the time required to program a flash memory cell can result in performance gains.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 8 depicts a performance comparison of the fast SLC burst program sequences of FIGS. 7A and 7B according to example embodiments of the disclosed technology and the existing SLC cache program sequence of FIG. 6A.

Figure 1:
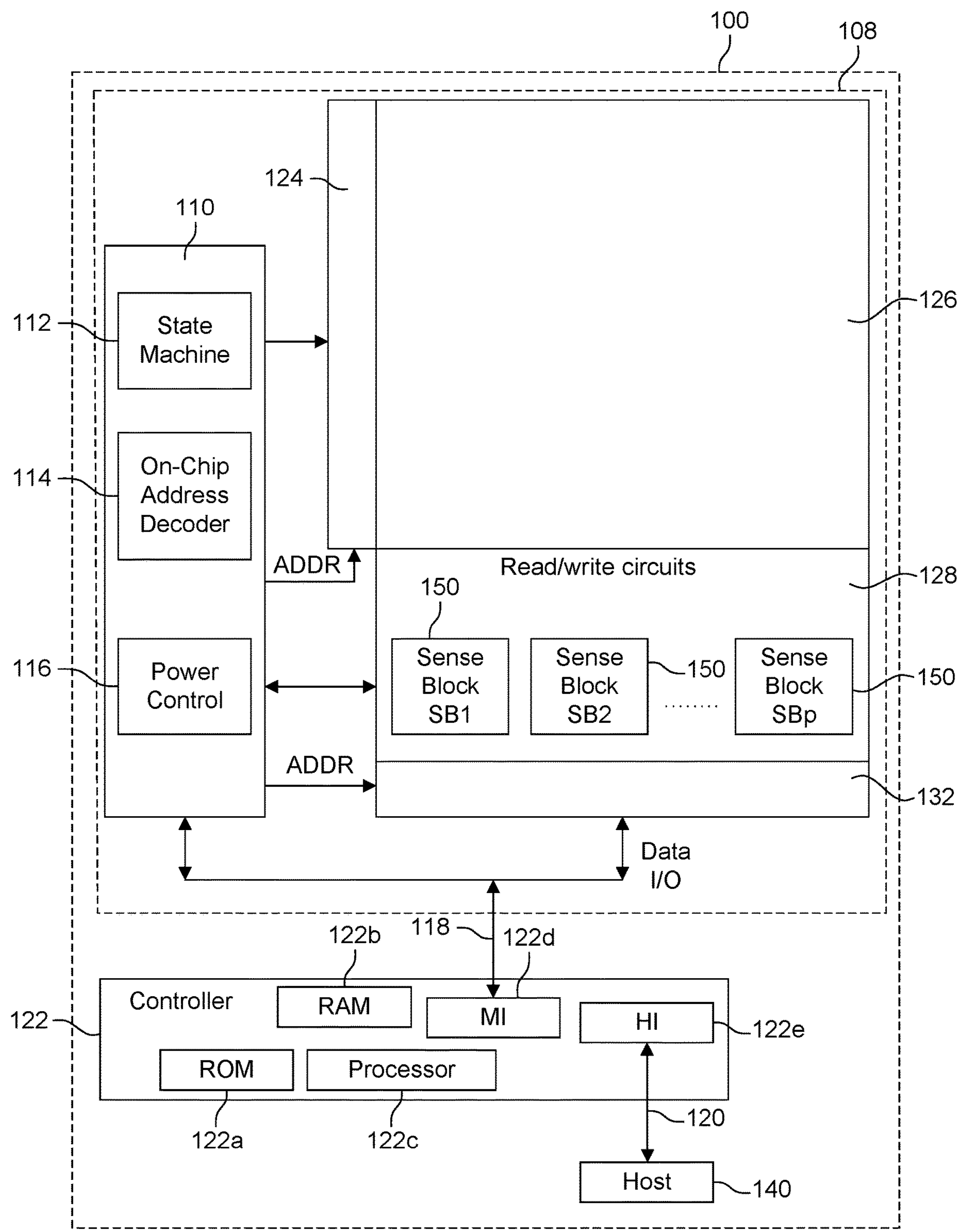
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

Flash memories, including NAND flash memories, store data in memory cells comprised of CTL transistors or FG transistors. These types of MOSFETs differ from a regular MOSFET in that they include an electrically insulated gate between the control gate and the channel. As a result of this electrical isolation, any electron reaching this electrically insulated gate will become trapped there even after an applied voltage is removed. This gives flash memory its non-volatile property. Unlike a regular MOSFET, however, which has a fixed threshold voltage, the threshold voltage of a CTL or FG MOSFET depends on the amount of charge stored in the gate (i.e., the more charge that is stored, the higher the threshold voltage). Thus, data can be stored in a flash cell as the threshold voltage of the cell, based on the logical value that the threshold voltage represents.

In some embodiments, a NAND flash memory block, for example, may include multiple NAND strings. In the case of a 3D NAND architecture, each NAND string may include potentially several thousand memory holes, where each memory hole includes a collection of wordlines that are shared among all memory holes/strings/blocks of the 3D NAND structure. That portion of a wordline corresponding to a given memory hole may constitute a single, flash cell within the NAND structure. A number of bitlines may be provided that is equal to a number of memory holes in a given NAND string. Each bitline may connect a respective memory hole from each NAND string across all strings/blocks of the NAND structure.

Flash memory cells are connected in a hierarchy that allows for efficient data access. Referring to an example 3D NAND flash architecture in more detail, a 3D NAND structure may include two distinct planes, each of which includes multiple vertically stacked layers that constitute the wordlines of the 3D NAND structure. Each plane may include multiple NAND blocks that extend both horizontally across the plane as well as vertically through the wordline Dyers. Each NAND block may be comprised of four NAND strings, in an example implementation. Each NAND string, in turn, may include 16K memory holes, which may be referred to collectively as a page. Each memory hole may extend vertically through the wordline layers of the 3D NAND structure, with each memory hole/wordline intersection representing a single cell of the NAND structure.

In some embodiments, a respective bitline may be provided for each memory hole such that a given bitline connects a respective corresponding memory hole from each NAND string of each NAND block of the 3D NAND structure. More specifically, within a given NAND block, each NAND string may include, for example, 16K memory holes. In some embodiments, the memory holes of a given NAND string may be arranged in rows (e.g., 4 rows) that are offset with respect to one another. As such, in some embodiments, each bitline may connect a respective memory hole from each NAND string and may extend across all NAND blocks, where each respective memory hole connected to the same bitline occupies a same relative position within the arrangement of memory holes of a corresponding NAND string. Thus, assuming 16K memory holes in each NAND string, 16K bitlines may be provided, where each bitline connects a respective one memory hole from each NAND string. As previously noted, in the case of NAND flash, a NAND string, which may include 16K memory holes in an example implementation, is the minimum unit for read and programming operations, whereas a block (e.g., including 4 NAND strings) is the smallest unit for erase operations.

To program a flash memory cell, a high voltage is applied to the wordline that includes the cell to be programmed. In particular, a programming voltage $V_{PGM}$ is applied to the control gate of the transistor of the cell sought to be programmed. The applied voltage is coupled to the CTL through the dielectric, which raises the CTL to $V_{PGM}$, and ultimately results in electrons breaking the oxide barrier and accumulating on the CTL. Stated another way, application of $V_{PGM}$ to the control gate generates a high electric field with—a strong negative charge on the transistor's source and drain and a strong positive charge on the control gate—that causes the electrons to migrate from the channel to the CTL. This increases the threshold voltage of the transistor of the cell and corresponds to storing a logic 0 state in the cell. In contrast, a flash memory cell is erased by applying an erase voltage VERA to a source or drain of the transistor to generate an electric field—with a strong positive charge on the cell's source and drain and a strong negative charge on the control gate—which induces a tunneling effect, referred to as Fowler-Nordheim (FN) tunneling, whereby electrons migrate from the CTL to the channel. This lowers the threshold voltage of the transistor of the cell and corresponds to a logic 1 state for the cell.

Programming a multi-bit flash memory cell may require multiple programming pulses depending on the particular bit information sought to be stored in the cell and the number of programming pulses needed to bring the cell's underlying transistor to the appropriate threshold voltage that corresponds to the bit information sought to be stored. In a single-bit flash memory cell, only two states are possible: a programmed state corresponding to a logic 0 and an erase state corresponding to a logic 1. Thus, programming an SLC cell generally requires a single program pulse. Programming an SLC cell may include applying a single program pulse to the cell followed by a verify pulse to ensure that the program pulse resulted in a threshold voltage for the cell's transistor that corresponds to the programmed state (i.e., the logic 0 state). If the verify pulse indicates that the cell was not adequately programmed, another program pulse/verify pulse sequence may be performed. In some cases, SLC flash may have a selectable mode whereby only a program pulse is applied with no verify pulse. In light of the inclusion of error correcting bytes with the actual data, a verify pulse may become unneeded if data errors are corrected using the error correcting bytes.

It should be appreciated that as the level of bit information capable of being stored in a flash cell (e.g., MLC, TLC, etc.) increases, so too does the number of programming pulses that may be needed. For example, TLC may require, at a minimum, 7 programming pulses to account for the 7 different programmed states, and perhaps even more (e.g., 9-10 pulses) to provide some margin for fresh cells or the like. Each pulse may cause the cell's transistor to reach a different threshold voltage attainable by the cell, where each such threshold voltage corresponds to a different three bits of information.

NAND flash memory may be programmed on a per-page basis, with an example page size being 16K bytes. After a program command is entered including moving 16K bytes of data into a page buffer, an internal program operation sequence may be initiated. In recent years, the data input/output (I/O) time has continually decreased due to performance improvements to the NAND interface. Notwithstanding this, and despite the data input time being shorter than the program time, it nonetheless has a significant impact on total performance time. Accordingly, any techniques to reduce the impact of data input time on total program time generate a technical benefit by improve flash programming performance.

One such technique is the cache program function provided by various flash memory technology (e.g., SLC flash technology). Assume, for example, that a program command and the page data to be programmed have been provided, and that a program operation for programming the page data has begun. In a cache program sequence, before the programming of the page data ends (e.g., soon after the programming is initiated, concurrently with initiation of the programming, etc.), the page buffer is released to allow the next page data to be entered. In this manner, the data I/O time for entering the next page data can be hidden within the programming time of the prior page data. Thus, cache program functionality reduces the overall total program time by eliminating the overhead associated with each subsequent page data transfer after the initial page data. In particular, with cache program functionality, the total program time is a function of the command overhead for only the initial page data, the number of pages programmed, and the program time per page.

Embodiments of the disclosed technology further improve upon this reduction in total programming time provided by cache program functionality, and thus, provide a technical improvement over existing flash memory programming techniques. In particular, example embodiments of the disclosed technology further reduce the total program time by providing a fast program burst mode according to which a voltage pump is maintained in an ON state and the transfer of next page data from the page buffer to the data latches is overlapped with the wordline/bitline (WL/BL) discharge that occurs during a programming phase of the program operation for the current page data. More specifically, if a user wishes to burst program a big chunk of data in the same block, for example, and is able to stream in the next page data before the WL/BL discharge completes for the current program operation, then the data transfer from the page buffer to the data latches can be hidden within the WL/BL discharge time by eliminating the charge pump reset and charge up time after each program operation.

In this manner, flash memory programming performance can be further improved, particularly in the case of programming large chunks of data sequentially. That is, the burst mode programming techniques disclosed herein and the significant reduction in programming time that they offer provides a particular technical benefit in scenarios in which a large chunk of data needs to be programmed quickly. An example application for the burst mode programming techniques disclosed herein is the Safety Control Rod Activation Mechanism (SCRAM) mode for enterprise solid state devices (SSDs). In the SCRAM mode, in order to prevent data loss upon a sudden loss in power, host data in the volatile dynamic random access memory (DRAM) is flushed to non-volatile NAND prior to SSD holdup capacitors losing charge. Fast burst mode programming techniques according to embodiments of the disclosed technology can be employed to ensure that data is transferred from volatile DRAM to non-volatile NAND without any resultant host data loss, and at the same time, can potentially reduce the number of holdup capacitors that need to be used.

It should be appreciated that the terms current and previous may at times be used interchangeably herein (as in "current page data" or "previous page data") to distinguish page data that is or was being programmed as part of a particular program operation from next page data that was moved into the page buffer during the particular program operation, and which is further moved from the page buffer to the internal data latches during the particular program operation, in accordance with embodiments of the disclosed technology. It should further be appreciated that while example embodiments of the disclosed technology are described herein using SLC NAND flash technology that may, as an example, employ a single program pulse with no verify pulse, such embodiments can be extended to other multi-level flash technologies.

FIGS. 1 to 4G depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122*c*, ROM 122*a*, random access memory (RAM) 122*b*, a memory interface (MI) 122*d*, and a host interface (HI) 122*e*, all of which may be interconnected. The storage devices (ROM 122*a*, RAM 122*b*) store code (software) such as a set of instructions (including firmware), and one or more of the processors 122*c* are operable to execute the set of instructions to provide functionality described herein. Alternatively or additionally, one or more processors 122*c* can access code from a storage device in the memory structure, such as a reserved area of memory cells connected to one or more wordlines. RAM 122*b* can be used to store data for controller 122, including caching program data (discussed below). MI 122*d*—in communication with ROM 122*a*, RAM 122*b*, and processor(s) 122*c*—may be an electrical circuit that provides an electrical interface between controller 122 and memory die 108. For example, MI 122*d* can change the format or timing of signals, provide a buffer, isolate from surges, latch I/O, etc. One or more processors 122*c* can issue commands to control circuitry 110 (or another component of memory die 108) via MI 122*d*. Host interface 122*e* provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
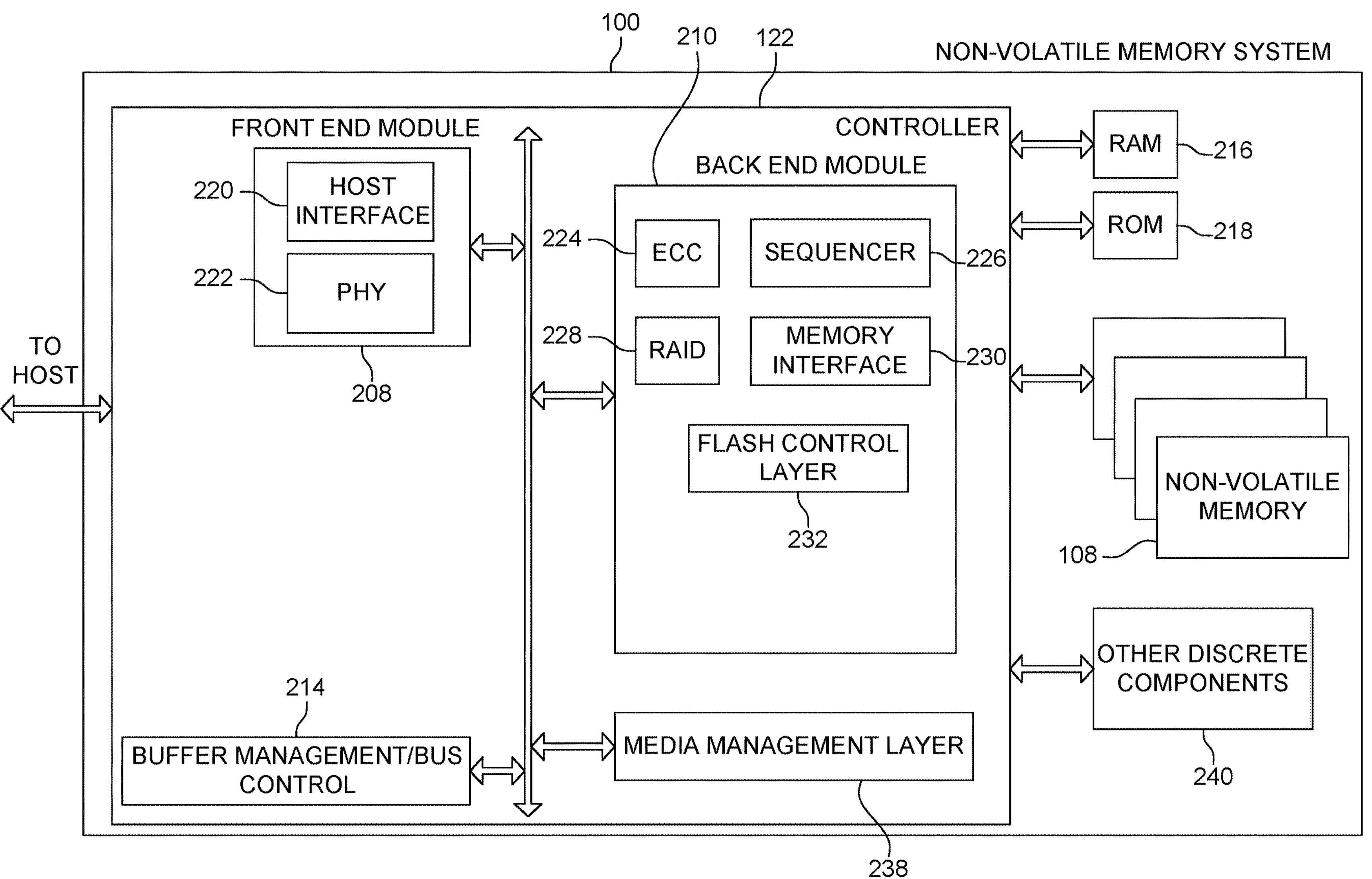
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
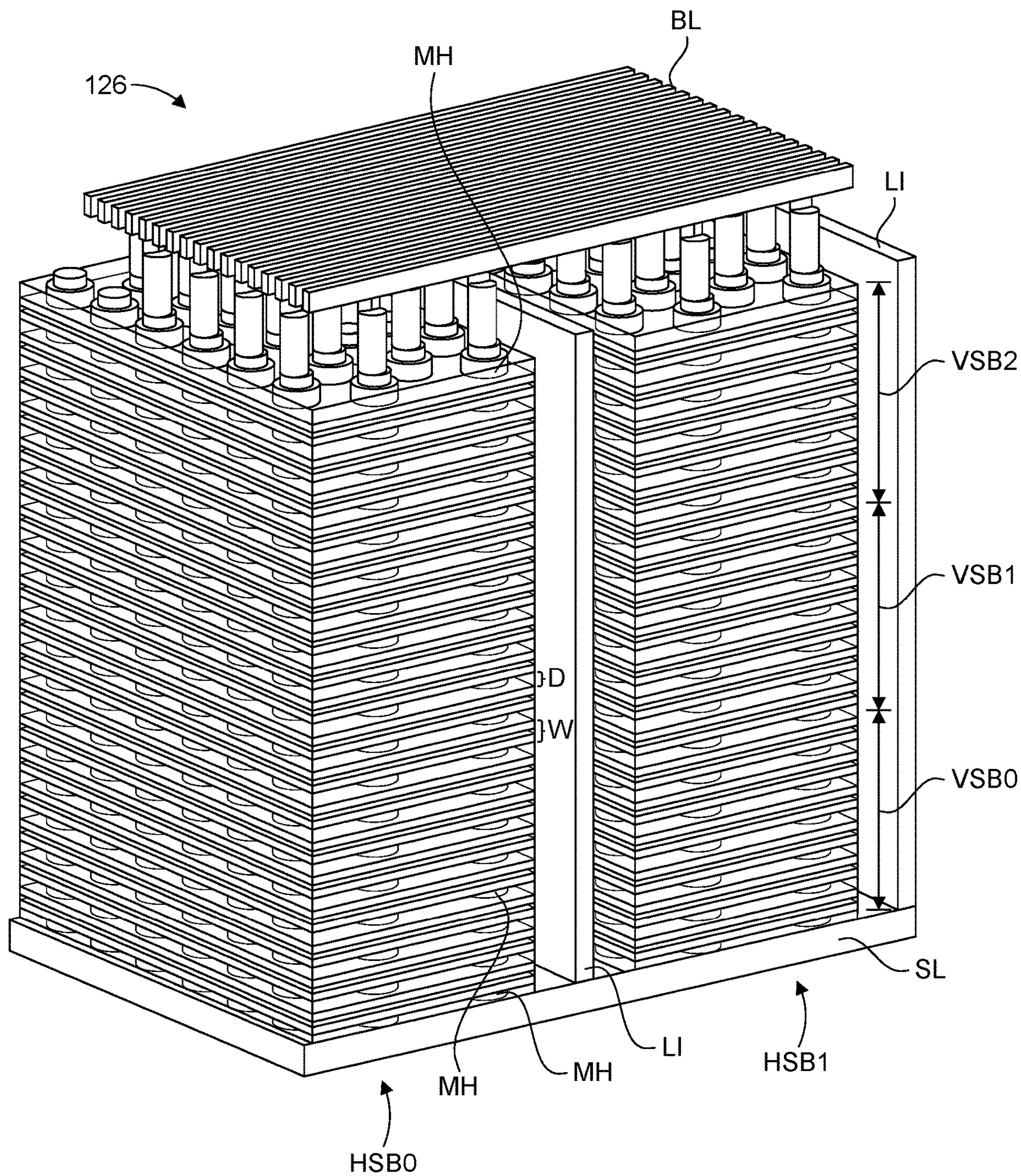
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
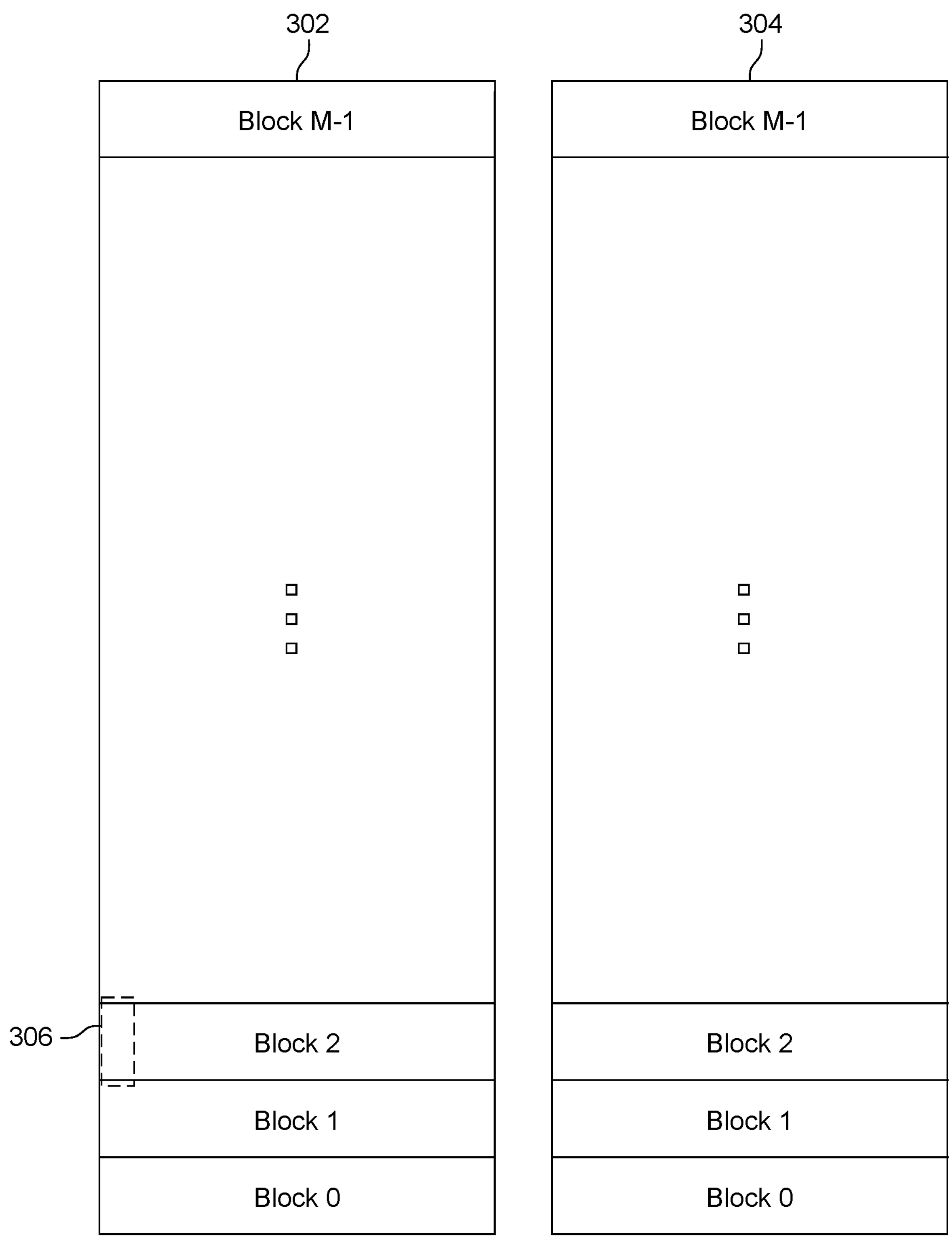
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
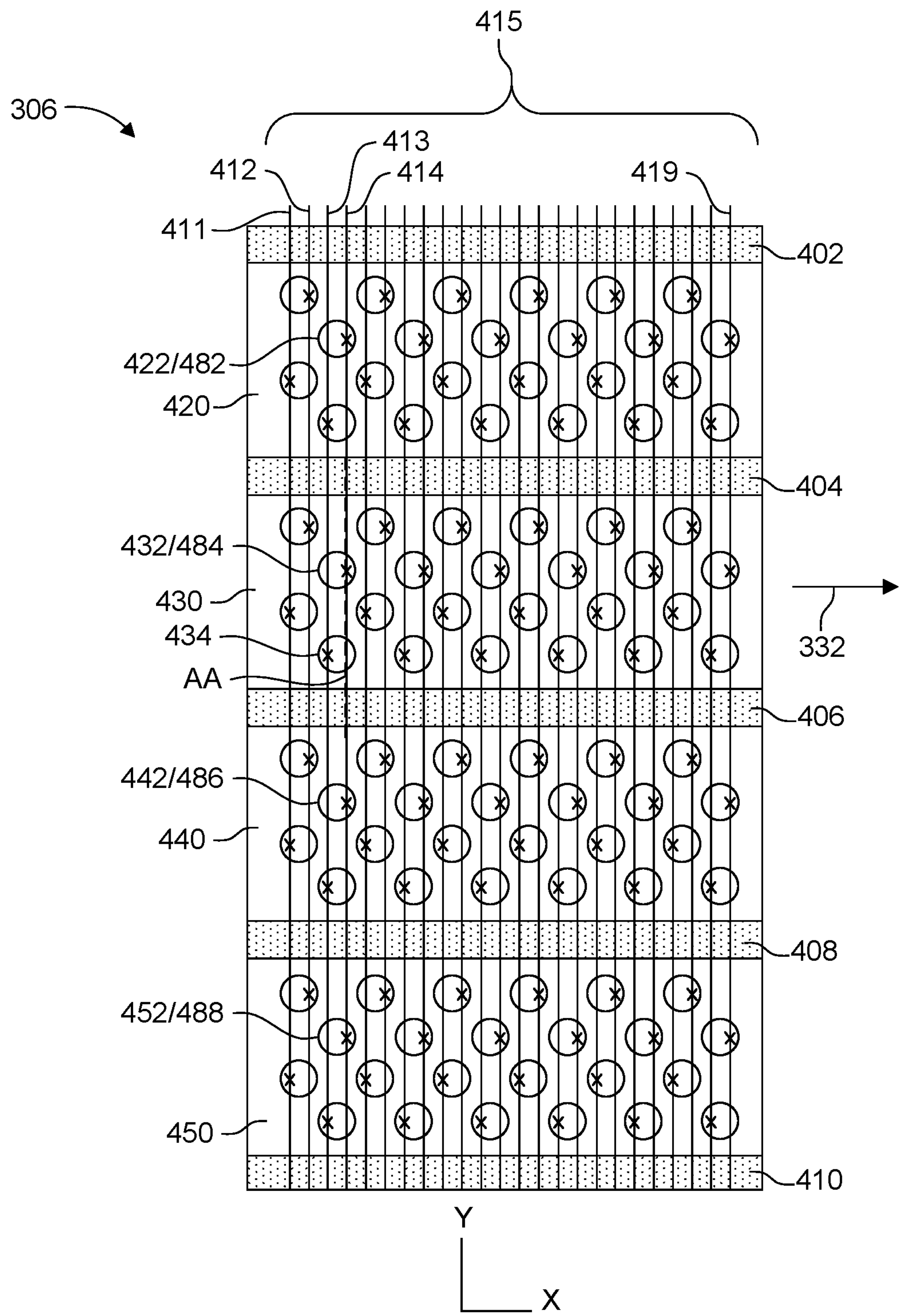
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
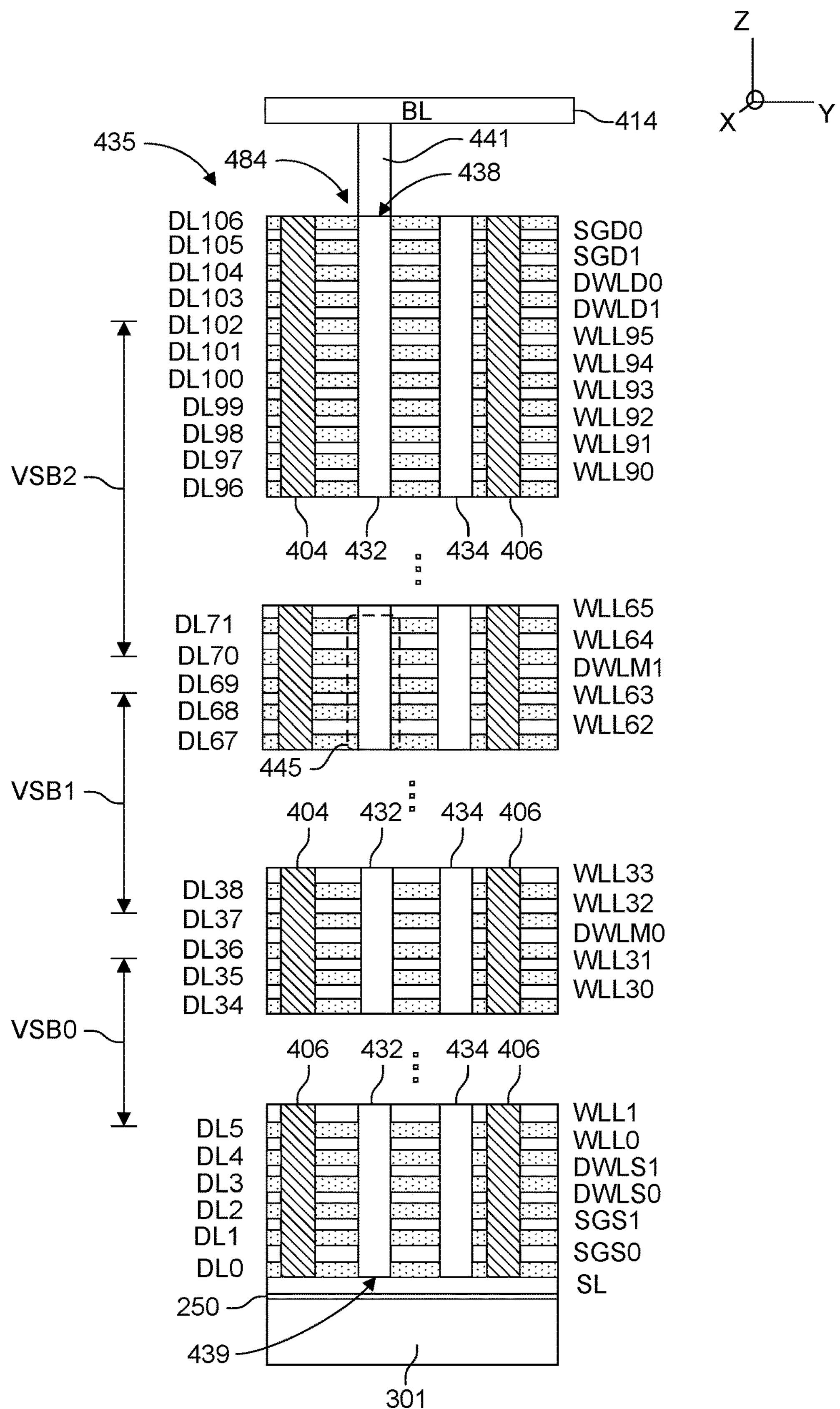
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
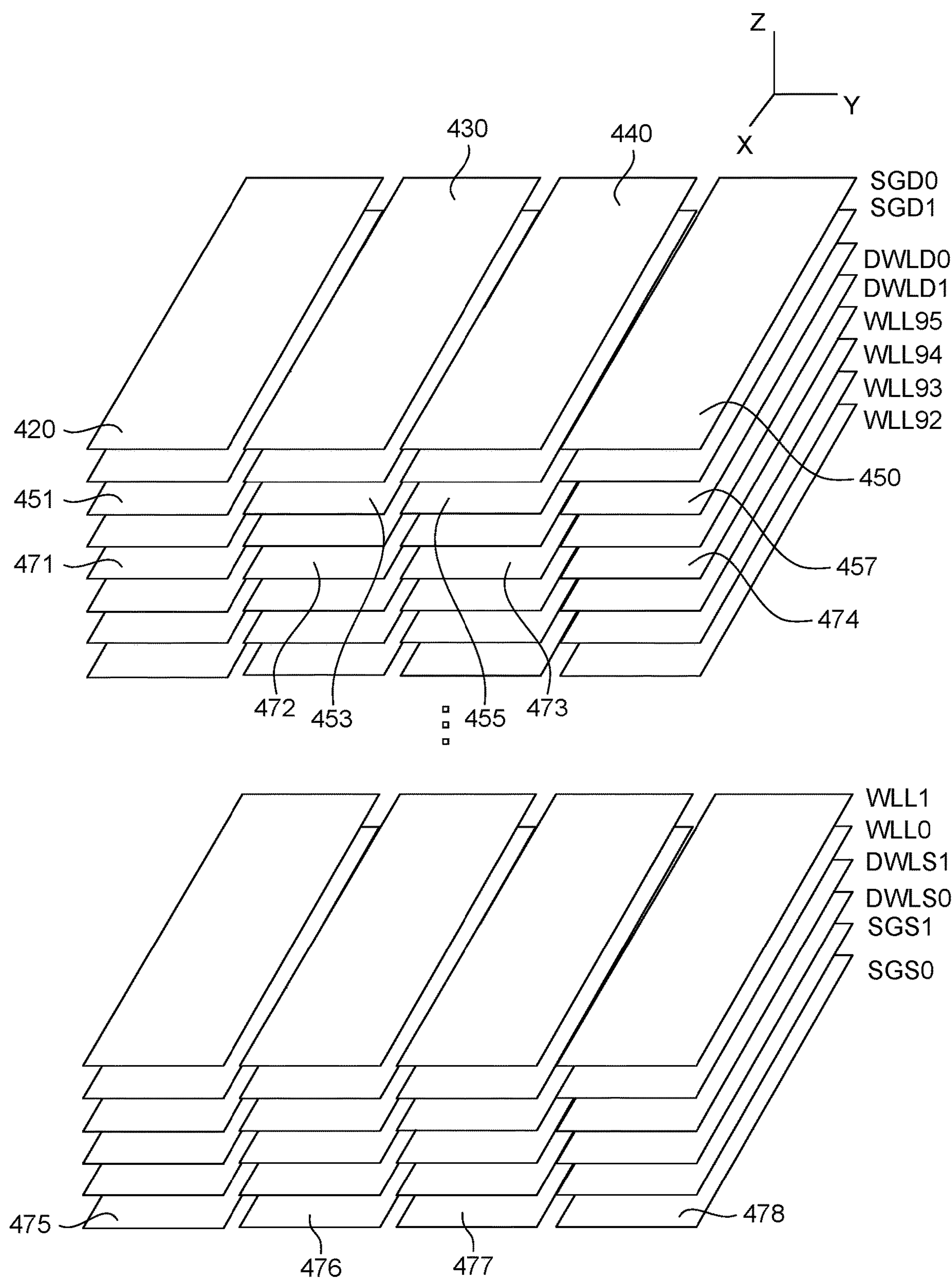
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
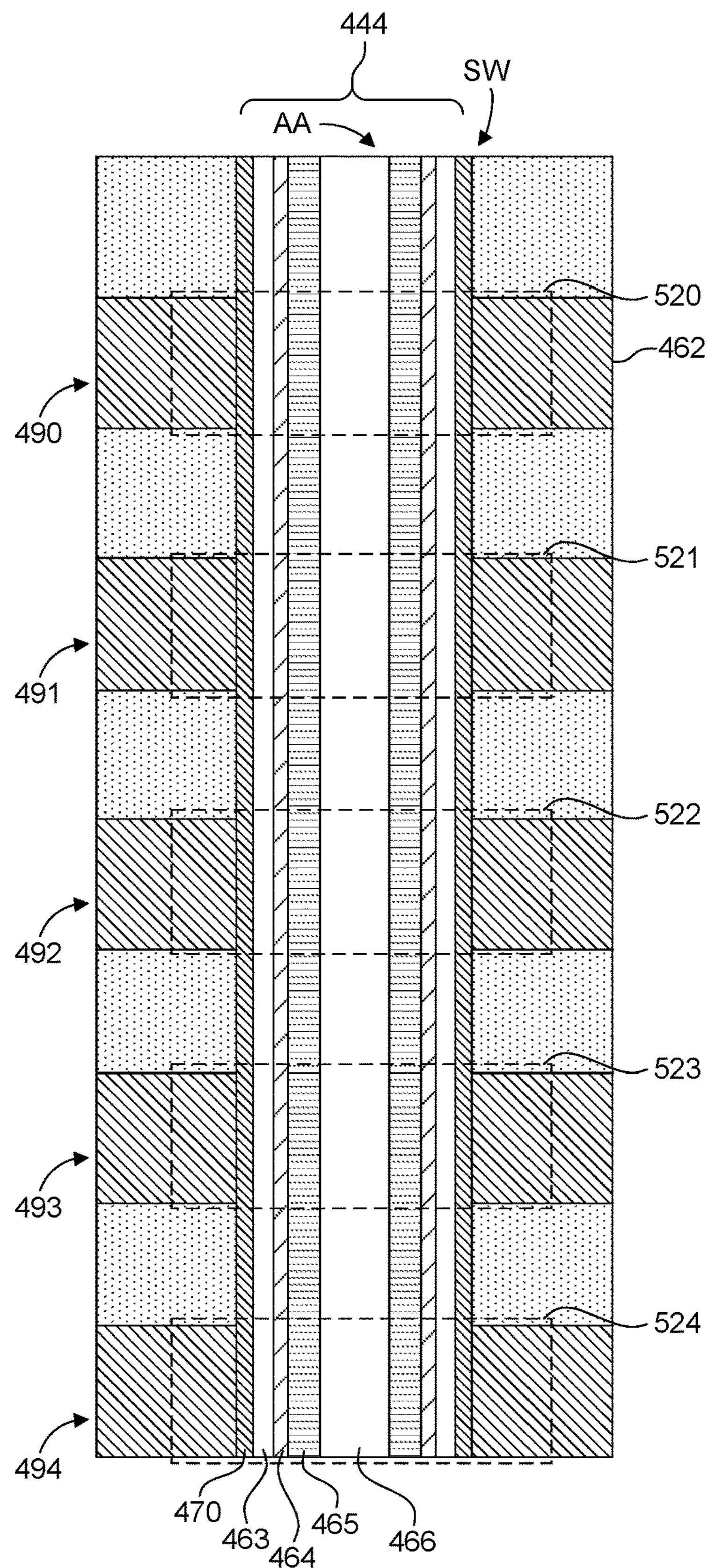
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
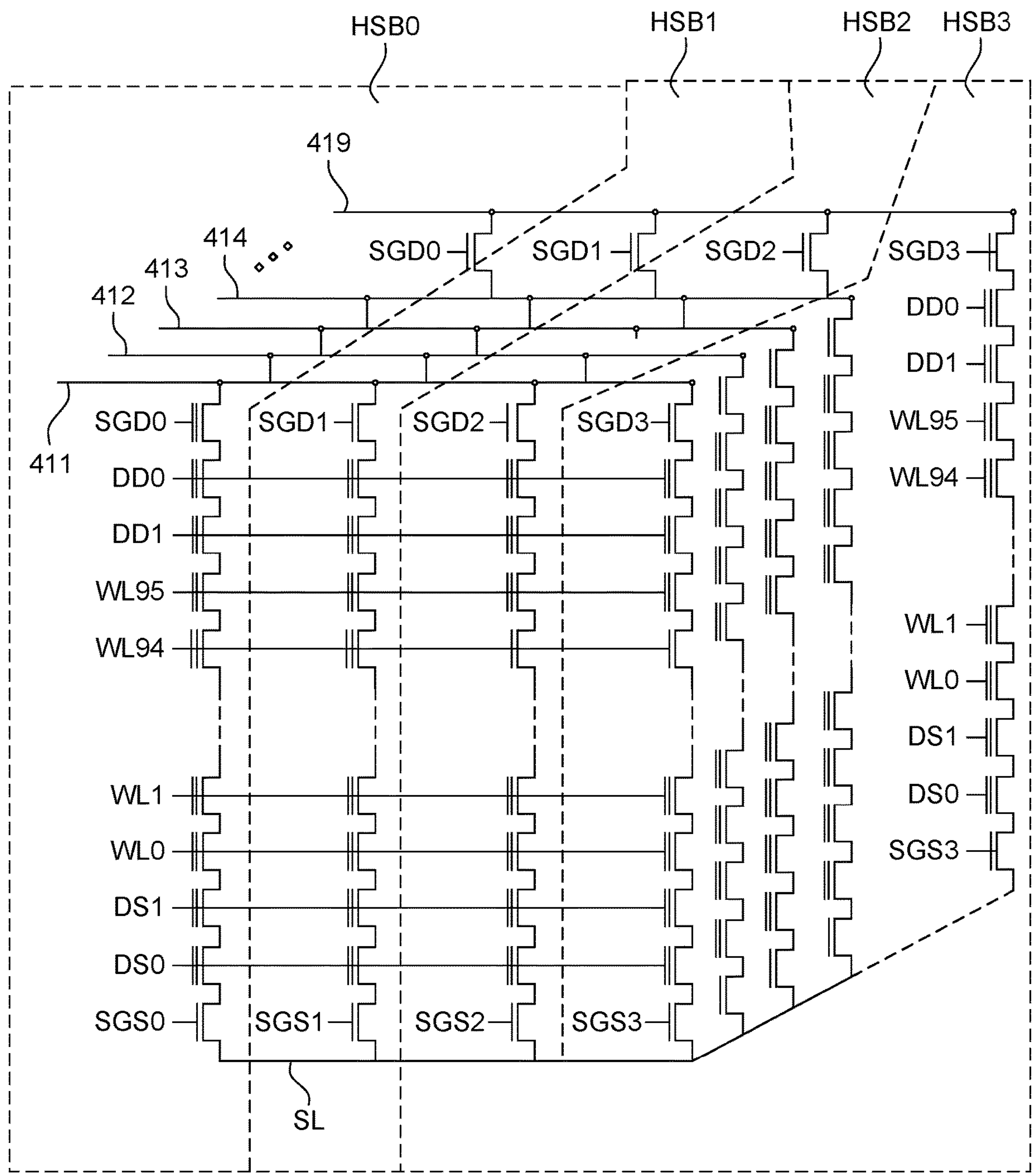
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
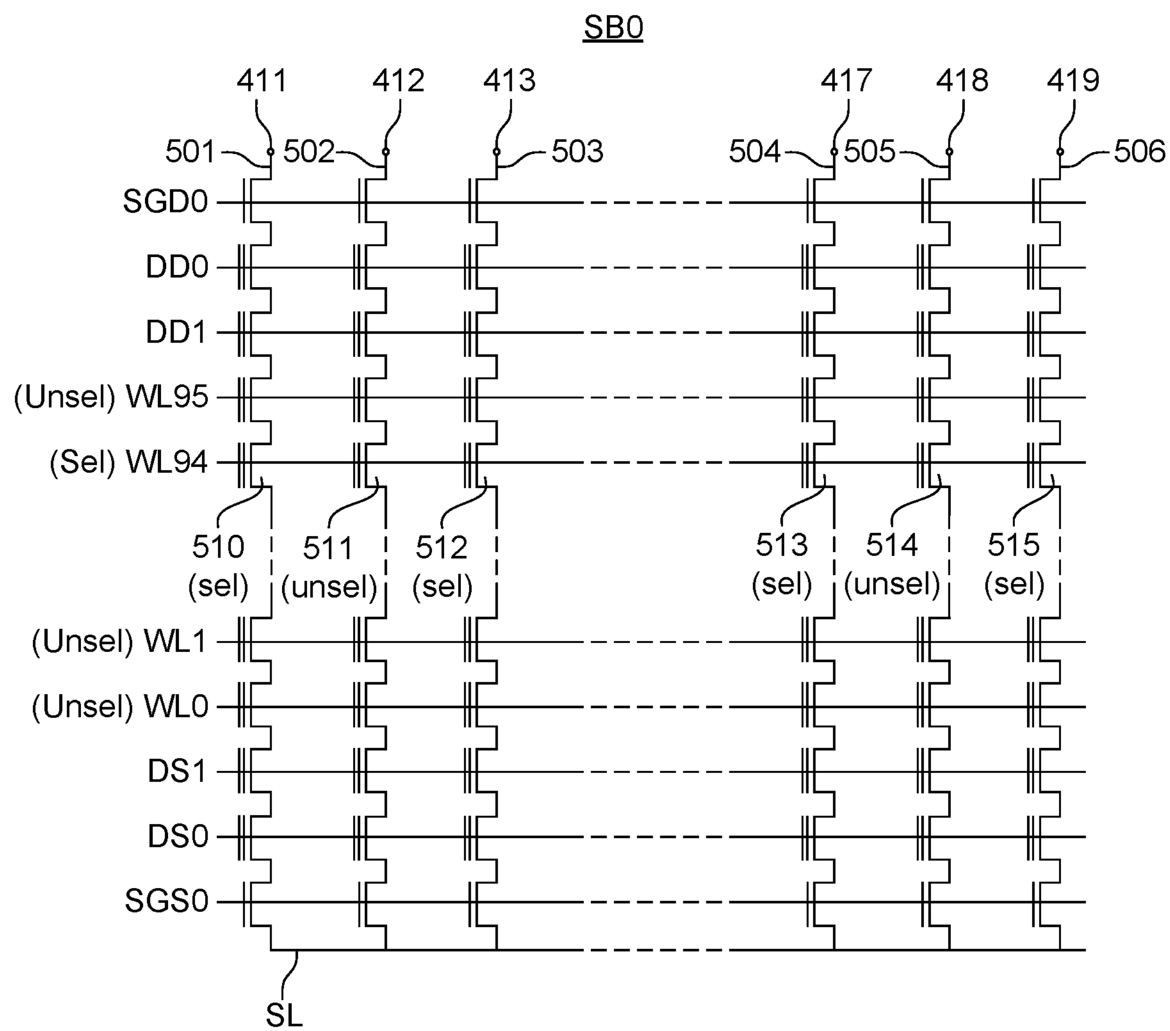
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
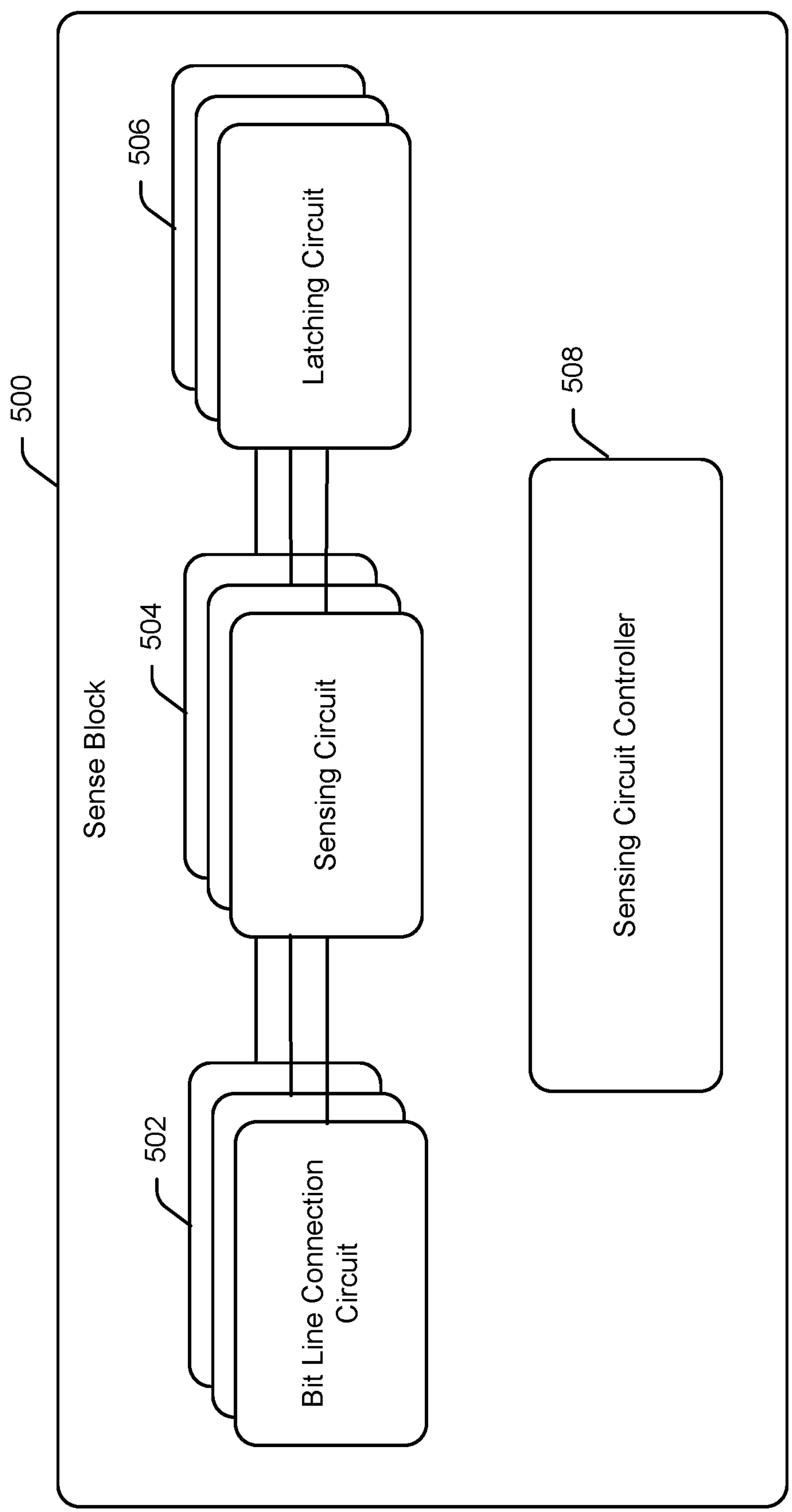
FIG. 5 is a schematic of an example sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6A:
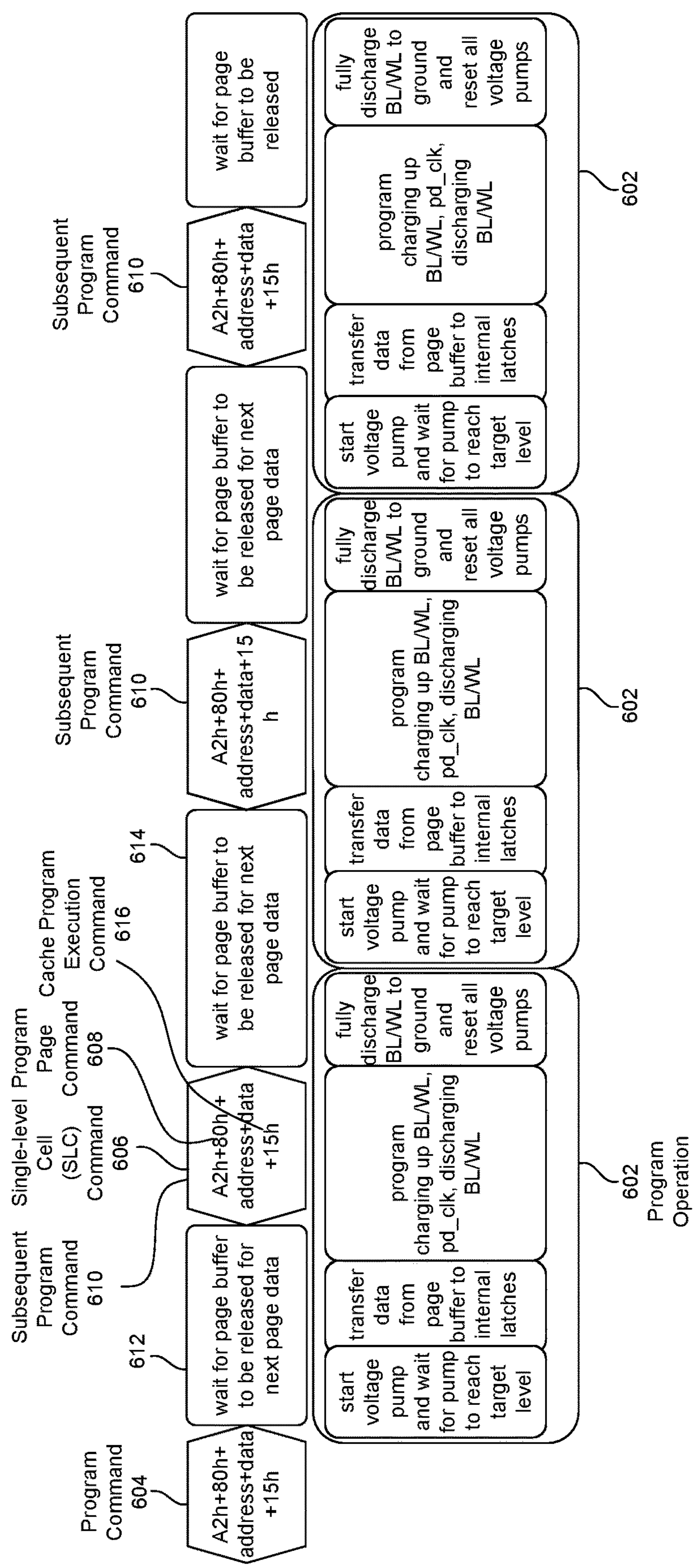
FIG. 6A schematically depicts an existing single-level cell (SLC) cache program sequence.

FIG. 6A schematically depicts an existing SLC cache program sequence. As depicted, the existing SLC cache program sequence of FIG. 6A includes a series of program operations 602. Each program operation 602 begins with the charge-up of one or more voltage charge pumps (referred to hereinafter in the singular for ease of explanation) to a target voltage level. Once the charge pump has reached the target level, page data contained in a page buffer is transferred to internal data latches in order to make the page buffer available for the next page data. The internal data latches may be sense amp data latches, which may be used to bias the bitlines as necessary to program the flash memory cells in accordance with the page data. Once the page data is transferred to the internal data latches and the page buffer is released, the program operation 602 continues with the programming of the transferred page data into the memory cells (referred to herein as a programming phase of the program operation), and upon completion of the programming phase, discharge of the WL/BLs to ground and reset of the charge pump.

Prior to initiation of the initial program operation 602, an initial program command 604 is issued. In the cache program mode, the overhead associated with this initial program command 604 is the only program command overhead that contributes to the total programming time since the overhead associated with each subsequent program command for each additional page data to be programmed is hidden within the programming time for the previous page data. Assuming an I/O speed of 1200 Mbps and 16K bytes of page data being entered, the time to issue the first program command 604 including the corresponding page data should be less than 15 μs (e.g., about 14 μs) assuming a 1 plane program or less than 30 us for a 2 plane program. For illustrative purposes, the overhead of a program command will be assumed to be about 15 μs. Only the initial program command 604 contributes this 15 us to the total program time because, as noted earlier, each subsequent program command 604 is hidden within the programming time for the previous page data.

The program command 604 includes a command 606 (i.e., A2h) to indicate that SLC flash memory cells are being programmed. Commands other than command 606 may be used for MLC flash cells, TLC flash cells, or the like. The command 604 further includes a program page command 608 (i.e., 80 h) to indicate that the addresses for the page data to be programmed follow the program page command 608. The page data itself (e.g., 16K byte data) may then follow the address information. Finally, a cache program execution command 616 (i.e., 15 h) may follow the page data. The cache program execution command 616 may indicate that a program page cache mode operation is to be performed.

After the initial program command 604 is issued, an initial program operation 602 may be initiated. The initial program operation 602 may begin with charging of a charge pump to a target voltage level, followed by transfer of the page data in the page buffer to internal data latches. The time for initially starting up the charge pump and transferring the page data to the data latches may represent a waiting time 612, at the conclusion of which, the page buffer may be released, thereby permitting the next page data to be moved into the page buffer. Concurrently with the end of the waiting time 612, programming of the current page data may be initiated. The page buffer may be released concurrently with initiation of the programming of the current page data or shortly thereafter. It should be appreciated that concurrently, as that term is used herein, may refer to two things occurring at the same time or within a very small window of one another, the duration of which may be determined based the particular technical field/context.

The programming phase of each program operation 602 may include charging up WL/BLs, programming the memory cells, and then discharging the WL/BLs. After the cell programming is complete, and still during what is referred to herein as the programming phase, the WL/BLs may be discharged to a voltage (e.g., 6V) that is significantly lower than the programming voltage (e.g., 20V), and one that is unlikely to cause threshold voltage shift over a short period of time, but not discharged all the way to ground, in the event that additional program operations will occur in the near future. Subsequent to release of the page buffer, a next program command may be issued concurrently with the programming phase of the current program operation 602. As a result, the overhead associated with this next program command—which includes the SLC command 606, the program page command 608, address information for the next page data, the next page data itself, and finally the cache program execution command 616—does not contribute to the total program time.

As shown in FIG. 6A, after the cells are programmed and the WL/BLs in the memory array are partially discharged, an operation 616 that includes a full discharge of the WL/BLs to ground and a complete reset of the charge pump may occur. The full discharge of the WL/BLs may include discharging those portions of the WL/BLs forming part of the peripheral circuitry. As a result of this full discharge and reset operation 616, each subsequent program operation includes the overhead associated with charging up the charge pump to the target voltage level (which is about 2.5 μs), and the overheard associated with the subsequent transfer of page data from the page buffer into the internal data latches (which is also about 2.5 μs), which can only occur after the charge pump has reached the target level. As a result, after the initial charge-up of the charge pump and transfer of page data from the page buffer to the data latches as part of the initial program operation, each subsequent waiting period 614 for the page buffer to be released is longer than the initial waiting period 612, as each subsequent waiting period includes: 1) that portion of the programming time of a previous program operation 602 that occurs after the program command 610 for the next program operation is issued, 2) the time for the full discharge and reset operation 616 to be performed as part of the previous program operation, and 3) the charge pump start up time and time to transfer the page data from the page buffer to the data latches as part of the next program operation.

Figure 6B:
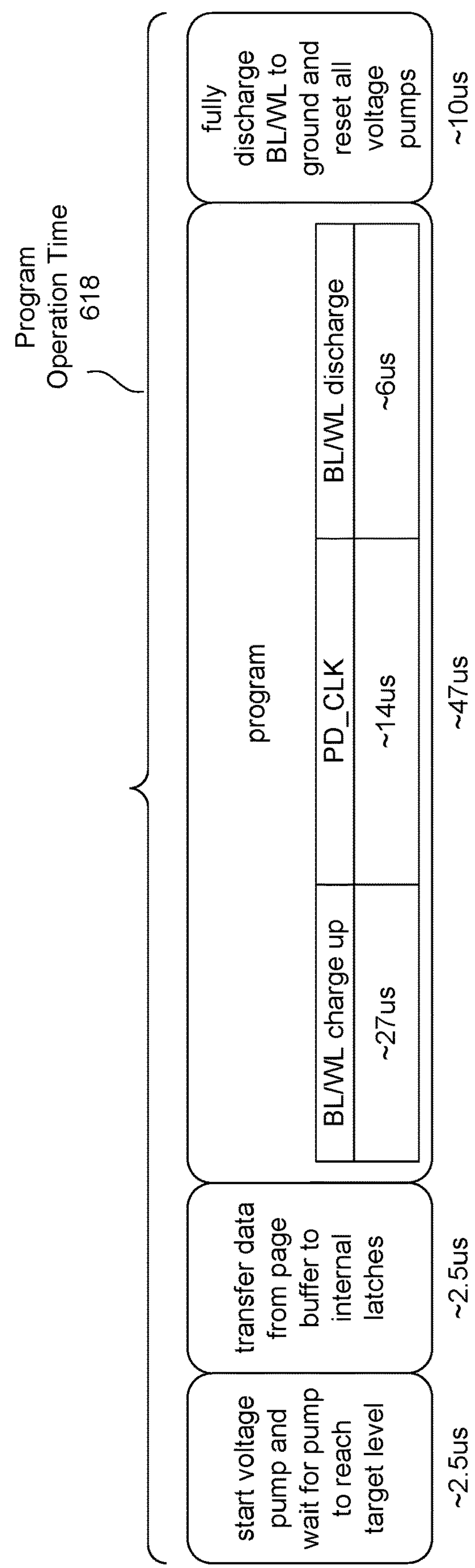
FIG. 6B schematically depicts the total program time breakdown for the existing SLC cache program sequence of FIG. 6A.

FIG. 6B schematically depicts the total programming time breakdown for the existing SLC cache program sequence of FIG. 6A. As depicted, each program operation 602 includes the time for the charge pump to reach the target voltage level (which is about 2.5 μs), the time for the page data in the page buffer to be transferred to the internal data latches (which is also about 2.5 μs), the programming phase time (which cumulatively is about 47 μs), and the time for the full WL/BL discharge and charge pump reset operation 616 to be performed (which is about 10 μs). Thus, the programming time 618 for each program operation 602 is about 2.5+2.5+47+10 μs=62 μs. The programming time of 47 μs includes a WL/BL charge-up time of about 27 μs, an actual flash cell programming time of about 14 μs (represented by PD_CLK), and a WL/BL partial discharge time of about 6 μs. Thus, the cache program scheme of FIG. 6A results in a total overall program time for n pages given by: (program operation time 618)*#pages+overhead of initial program command. This comes to approximately (62n+15) μs.

As previously noted, the program command overhead of about 15 μs for each program command after the initial program command does not contribute to the total program time of 62n+15 μs by virtue of being hidden within the program operation time associated with the prior program command. It should be appreciated that the various times described herein to perform various flash cell programming-related operations are approximate and may vary from memory die to memory die and may depend, for example, on the I/O speed, the number of planes in the die, and so forth. As such, while the actual program time savings may vary from product to product, the SLC burst program sequences disclosed herein (i.e., the SLC burst program sequences of FIGS. 7A and 7B) will always provide improved performance in the form of a reduced overall programming time over the cache program sequence of FIG. 6 by virtue of eliminating certain operations that are performed in the cache program sequence (e.g., eliminating the full WL/BL discharge and charge pump reset for each program operation except the last, which in turn, eliminates a need to perform a charge pump charge-up at the outset of each program operation) and/or hiding the time to perform an operation within the time required to perform another operation (e.g., hiding the time to transfer page data for a next program operation from the page buffer into internal data latches within the programming time of a prior/current operation). Notwithstanding this, actual times may nevertheless be expected to remain within a certain tolerance of the approximate times used herein, and thus, the significant reduction in total program time achieved by the burst program sequence technique according to example embodiments of the disclosed technology as compared to the cache program sequence will remain consistent across potential variations in individual times of various operations. While discussion of times hereinafter may not explicitly indicate so, it should be understood that they are approximations of actual real-world values.

Figure 7A:
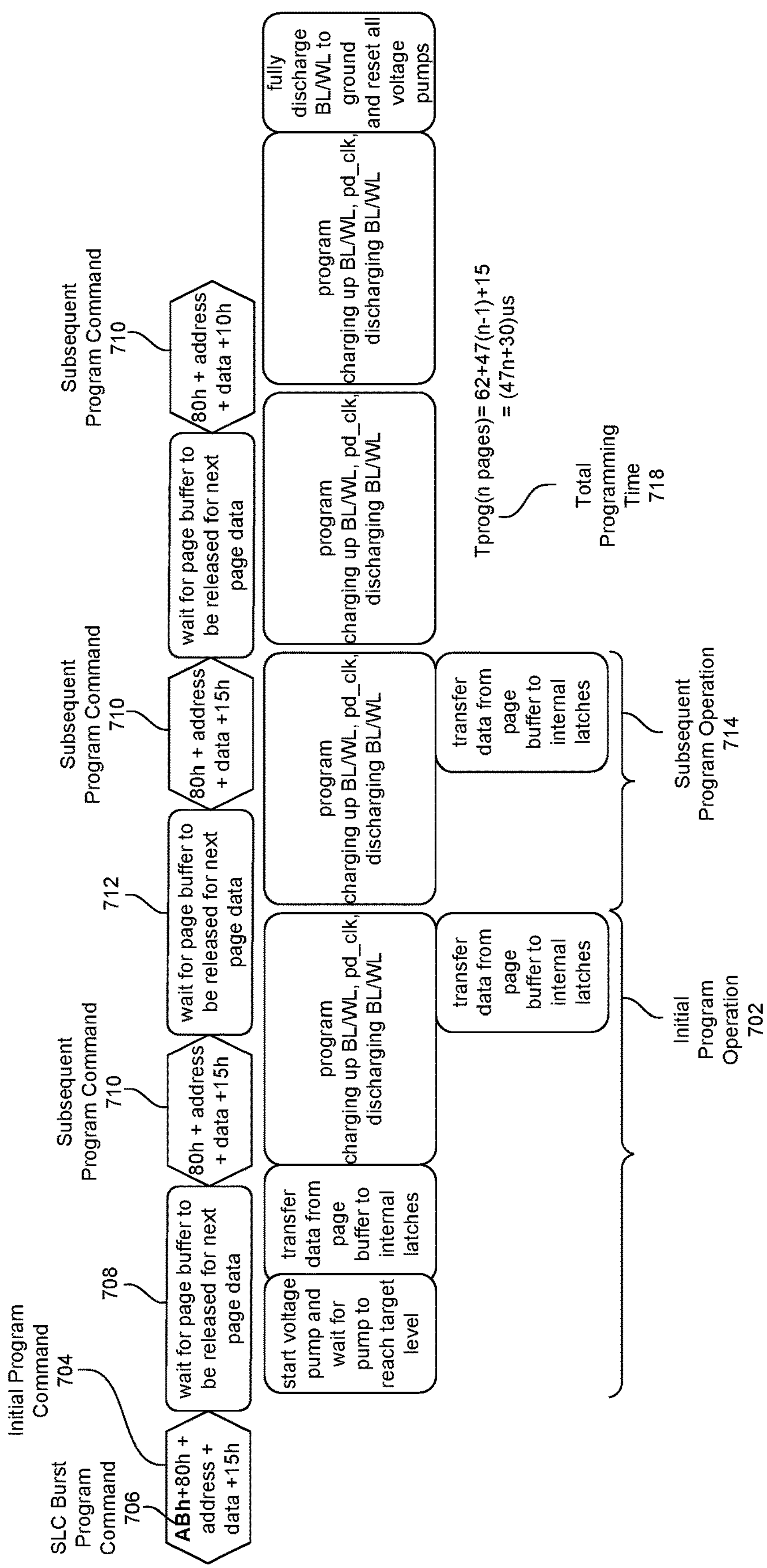
FIG. 7A schematically depicts a fast SLC burst program sequence according to example embodiments of the disclosed technology.

FIG. 7A schematically depicts a fast SLC burst program sequence according to example embodiments of the disclosed technology. The fast SLC burst program sequence improves significantly on the total program time of the SLC cache program sequence of FIG. 6A. Similar to the cache program sequence of FIG. 6A, the burst program sequence of FIG. 7A begins with an initial program command 704. As with the program command 602, the initial program command 704 may include a program page command (i.e., 80 h) to indicate that page data is to be programmed into memory cells at addresses that are identified following the program page command. The page data itself (e.g., 16K byte data) may then follow the address information. Finally, a cache program execution command (i.e., 15 h) may follow the page data to indicate that a program page cache mode operation is to be performed.

The initial program command 704, however, differs from the program command 602 in that the command 704 includes an SLC burst program command 706 (e.g., ABh) that indicates that the burst program sequence is to be performed. In some embodiments, the SLC burst program command 706 indicates that a large chunk of data in a block is to be programmed and that program operations will need to be performed quickly in succession as new page data is received, and thus, that the burst program sequence is to be employed. Similar to the cache program sequence of FIG. 6A, the overhead associated with the initial program command 704 as well as the overhead of each subsequent program command 710 may be 15 μs, but only the overhead of the initial program command 704 contributes to the total program time because the overhead associated with each subsequent program command 710 is hidden within the time of a prior program operation, and thus, does not contribute to the overall program time. As such, the SLC burst program mode of FIG. 7A achieves the overhead savings of the cache program mode. As described in more detail below, however, the SLC burst program mode also achieves additional overhead savings beyond that which is achieved in the cache program mode.

In particular, the burst program sequence depicted in FIG. 7A achieves additional overhead savings over the cache program sequence of FIG. 6A by, for example, eliminating the full WL/BL discharge and charge pump reset operation 616 from an initial program operation 702 as well as from each subsequent program operation 714, and only performing a full WL/BL discharge and charge pump reset operation 716 at the conclusion of all program operations (e.g., when there is no additional page data to programmed). This shaves off the amount of time required to perform the operation 716 (e.g., 10 μs) from each of (n−1) program operations, where n is the number of pages being programmed.

Moreover, because a full WL/BL discharge and charge pump reset is not performed at the end of each program operation in the burst program sequence, the charge pump operation that would otherwise have been needed to be performed to charge the charge pump up to the target voltage level at the beginning of each subsequent program operation (as required in the cache program sequence of FIG. 6A) is no longer needed. This shaves another 2.5 is off of each program operation excluding the initial program operation 702.

In addition, because the full WL/BL discharge and pump reset operation 716 is only performed at the end of the burst program sequence and not at the end of each program operation, and as a result, there is no longer a need to wait for the charge pump to charge up to the target voltage level at the beginning of each program operation prior to transferring page data for the next program operation from the page buffer into the sense ap latches, the next page data can now be transferred during the programming phase of the prior/current page operation, thereby hiding the page data transfer operation (2.5 μs) within the prior/current program operation. This, in turn, shaves the time to performed the page transfer operation (e.g., an additional 2.5 μs) off of every program operation excluding the initial program operation 702.

Thus, the total program time for programming n pages becomes the sum of: (1) the time for the initial program command 704, (2) the time required to perform the initial program operation 702, (3) the cumulative time required to perform each subsequent program operation 714, and (4) the time to perform the full discharge and charge pump reset operation 716. Assuming an I/O speed of 1200 Mbps, the time for the initial program command 704 is 15 is. The time required to perform the initial program operation 702 is given by the sum of the charge-up time for the charge pump (2.5 μs); the time to transfer page data from the page buffer to data latches (2.5 μs); and the time required to perform the programming phase which includes the sum of BL/WL charge up time (27 μs), the flash cell programming time (14 μs), and the partial BL/WL discharge time (6 μs). Thus, altogether, the time required to perform the initial program operation 702 is 52 μs.

The cumulative time required to perform each subsequent program operation 714 is the time required to perform a given subsequent program operation (47 μs) multiplied by the n−1 pages for which the subsequent program operations 714 are performed, which equals 47(n−1) μs. Each subsequent program operation 714 includes the BL/WL charge up time (27 μs), the flash cell programming time (14 μs), and the partial BL/WL discharge time (6 μs), but in contrast to the cache program sequence of FIG. 6A, does not include the time to transfer page data from the page buffer to data latches (2.5 μs) because this time is now hidden within the prior/current program operation time. In particular, in accordance with example embodiments of the disclosed technology, after the flash cell programming is completed for a given current program operation (which may be the initial program operation 702 or a subsequent program operation 714), the page data for the next program operation (which was placed in the page buffer earlier during the current program operation) may be transferred to the internal data latches during the partial BL/WL discharge time, and thus, may be hidden within the current program operation time such that it does not contribute to increasing the current program operation time.

Finally, the time to perform the full WL/BL discharge and charge pump reset operation 716 is 10 μs. Thus, the cumulative program time 718 for n pages of page data using the fast SLC burst programming technique illustrated in FIG. 7A is: 15 μs (the time to issue the initial program command 704)+52 μs (the time to perform the initial program operation 702)+47(n−1) μs (the cumulative time to perform each subsequent program operation 714)+10 μs (the time to perform the full WL/BL discharge and charge pump reset operation 716)=15+52+47(n−1)+10=62+47(n−1)+15=(47n+30) μs. The fast SLC burst program mode according to embodiments of the disclosed technology provides a significant improvement in total programming time over the cache program sequence of FIG. 6A, which as previously noted, is 62n+15 μs, for n pages of page data. More specifically, the total program time savings is given by: (62n+15)−(47n+30)=15n−15=15(n−1). Therefore, the fast SLC burst program sequence of FIG. 7A provides total program time savings over the cache program sequence as long as the number of pages being programmed is greater than 1, and the total program time savings grows linearly with the number of pages to be programmed.

Figure 7B:
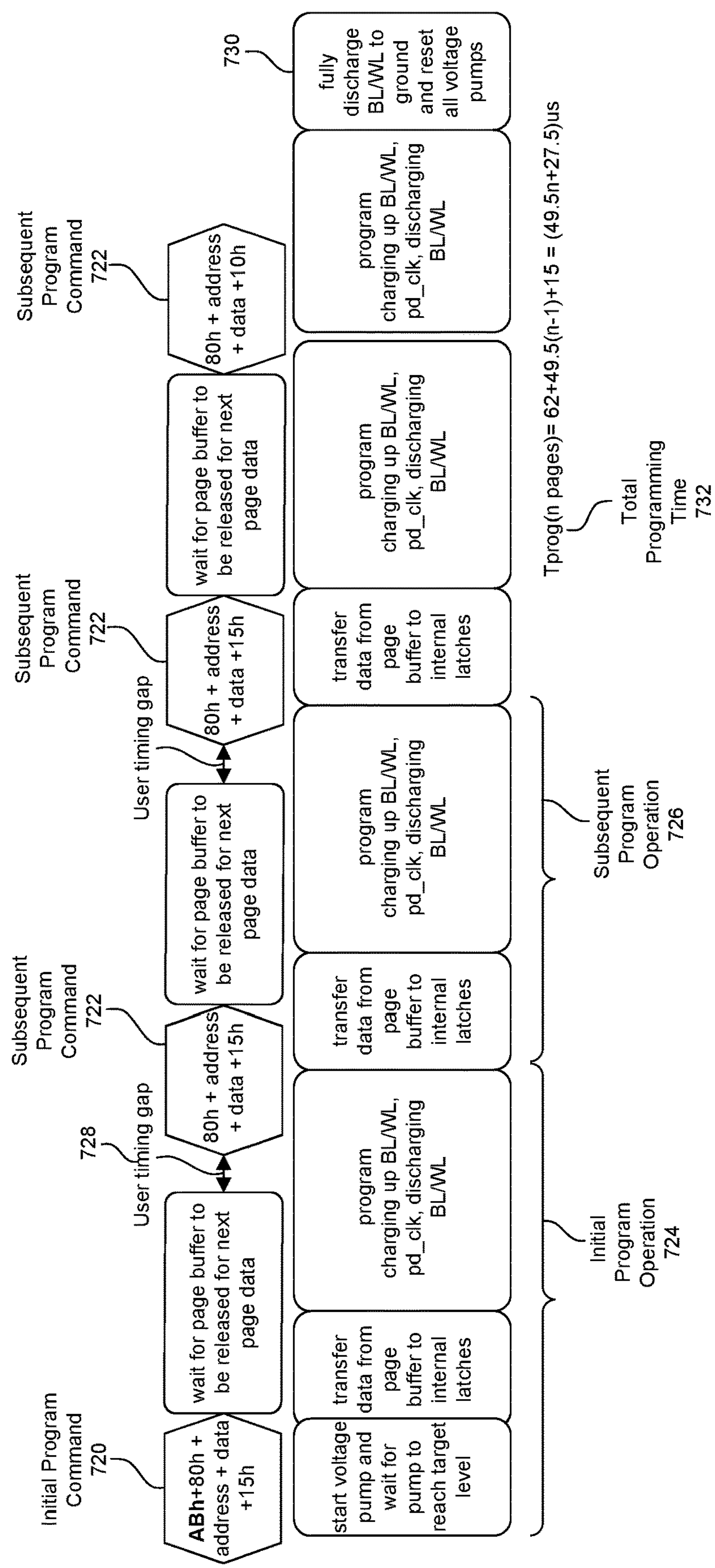
FIG. 7B schematically depicts an alternative fast SLC burst program sequence according to example embodiments of the disclosed technology.

FIG. 7B schematically depicts an alternative fast SLC burst program sequence according to example embodiments of the disclosed technology. In particular, FIG. 7B depicts an SLC burst program sequence variation that provides less total program time savings than the embodiment of FIG. 7A, but still represents a considerable improvement over the cache program sequence of FIG. 6A. The alternative SLC burst program sequence of FIG. 7B is similar to the SLC burst program sequence of FIG. 7A in that the burst program sequence of FIG. 7B begins with an initial program command 720 that is the same as or at least similar to the program command 704, followed by a charging up of the charge pump to a target voltage level and the transfer, to the internal data latches, of the page data that had earlier been moved into the page buffer as part of the initial program command 720. As with the burst program sequence of FIG. 7A, there may be a waiting period associated with charge-up of the charge pump and the transfer of page data from the page buffer to the internal data latches. After the page data transfer is complete, the page buffer may be released to permit the next page data to be moved into the page buffer, as part of a subsequent program command 722. This may occur concurrently with at least a portion of the initial program operation 724. The waiting period may be shorter for each subsequent program command 722 because (similar to the embodiment of FIG. 7A) the burst program sequence of FIG. 7B does not include the charge-up period for the charge pump for each subsequent program operation 726.

The embodiment of FIG. 7B does, however, differ from the embodiment of FIG. 7A in some respects. For instance, in the embodiment of FIG. 7B, the transfer of the next page data from the page buffer to the internal data latches is performed subsequent to completion of the prior/current program operation, rather than during the prior/current program operation as occurs in the SLC burst program sequence of FIG. 7A. In particular, rather than transferring the next page buffer from the page buffer to the internal data latches during the initial program operation 724 (as would occur in the embodiment of FIG. 7A), the page data transfer instead occurs after the initial program operation is complete. Similarly, for each subsequent program operation 726, the transfer of the next page data (which has already been moved into the page buffer) occurs only after the subsequent program operation is 726 μs complete. Thus, the additional savings of 2.5 μs per subsequent program operation 726 that is achieved with the burst program sequence of FIG. 7A is not achievable with the burst program sequence of FIG. 7B.

However, the burst program sequence of FIG. 7B is able to achieve all other program time savings that are achieved by the burst program sequence of FIG. 7A, including the 10 μs savings achieved for each subsequent program operation 726 (except for the last program operation) by not performing a full WL/BL discharge and charge pump reset operation 730 until after the last program operation, and the 2.5 μs savings achieved by not having to charge up the charge pump for each subsequent program operation 726 because the full WL/BL discharge and charge pump reset operation 730 is not performed until the end of the program sequence. This is on top of the savings that both the burst program sequence of FIG. 7A and the burst program sequence of FIG. 7B as well as the cache program sequence of FIG. 6A achieve by hiding the transfer of the next page data into the page buffer in the programming time of the prior/current program operation.

The alternative fast SLC burst program sequence of FIG. 7B can be used, for example, if a user is unable to guarantee that entry of the next page data into the page buffer can be completed before the partial WL/BL discharge that occurs during the programming phase of the prior/current program operation is complete. If such a guarantee cannot be provided, then the alternative fast burst program sequence of FIG. 7B can be employed in lieu of the burst sequence of FIG. 7A, such that the transfer of the next page data from the page buffer to the internal data latches is performed subsequent to completion of the prior/current program operation, thereby avoiding potential programming errors that could result from failure to fully move the next page data from the page buffer into the latches prior to completion of the prior/current program operation. The alternative SLC burst program sequence of FIG. 7B may also be utilized in those example scenarios in which there is a user timing gap 728 between when the page buffer is released and when the next page data is moved into the release page buffer. This user timing gap 728 may be dictated by user requirements, for example.

Similar to the embodiment of FIG. 7A, the total program time for the alternative SLC burst program sequence of FIG. 7B for programming n pages is the sum of: (1) the time for the initial program command 720, (2) the time required to perform the initial program operation 724, (3) the cumulative time required to perform each subsequent program operation 726, and (4) the time to perform the full discharge and charge pump reset operation 730. Again assuming an I/O speed of 1200 Mbps, the time for the initial program command 720 is 15 μs. As with the burst program sequence of FIG. 7A, the time required to perform the initial program operation 724 is given by the sum of the charge-up time for the charge pump (2.5 μs); the time to transfer page data from the page buffer to data latches (2.5 μs); and the time required to perform the programming phase (47 μs). Thus, altogether, the time required to perform the initial program operation 724 is 52 μs.

The cumulative time required to perform each subsequent program operation 726 is the time required to perform the WL/BL charge-up (27 μs), the cell programming time (14 μs), and the partial WL/BL discharge time (6 μs) (47 μs in total)—similar to the embodiment of FIG. 7A—but additionally includes the time required to transfer the next page data from the page buffer to the internal data latches (2.5 μs), which gives a total time of 49.5 μs. This time per subsequent program operation 726 is multiplied by the n−1 pages for which the subsequent program operations 714 are performed, which equals 49.5(n−1) μs. In particular, in the embodiment of FIG. 7B, the page data for the next program operation (which was placed in the page buffer earlier during the current program operation) is not transferred to the internal data latches during the partial BL/WL discharge time as in the embodiment of FIG. 7A, and thus, that time is no longer hidden within the current program operation time, and as such, contributes to increasing the current program operation time.

Finally, as with the embodiment of FIG. 7A, the time to perform the full WL/BL discharge and charge pump reset operation 716 is 10 μs. Thus, the cumulative program time 732 for n pages of page data using the alternative fast SLC burst programming technique illustrated in FIG. 7B is: 15 μs (the time to issue the initial program command 720)+52 μs (the time to perform the initial program operation 724)+49.5 (n−1) μs (the cumulative time to perform each subsequent program operation 726)+10 μs (the time to perform the full WL/BL discharge and charge pump reset operation 716) =15+52+49.5(n−1)+10=62+49.5(n−1)+15=(49.5n+27.5) μs. Thus, the alternative fast SLC burst program mode according to embodiments of the disclosed technology provides less of an improvement over the existing cache program sequence of FIG. 6A than the fast SLC burst program sequence of FIG. 7A ((49.5n+27.5) μs vs. (47n+30) μs), but still offers a significant performance advantage over the cache program sequence of FIG. 6A, which as previously noted, is (62n+15) μs, for n pages of page data.

Figure 7C:
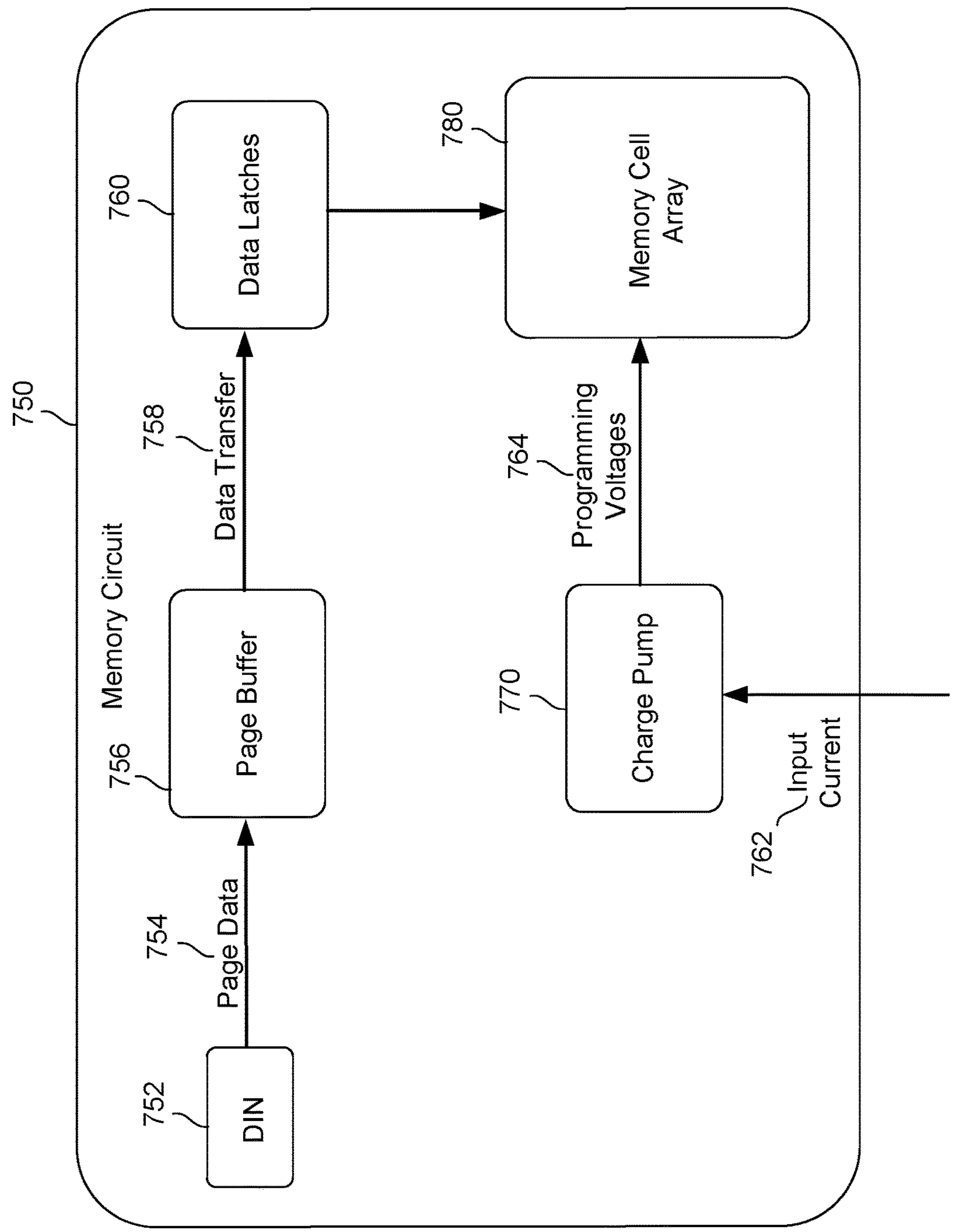
FIG. 7C is a schematic of an example SLC cache memory circuit configurable to implement SLC fast burst program sequences according to example embodiments of the disclosed technology.

FIG. 7C is a schematic of an example SLC cache memory circuit 750 configurable to implement SLC fast burst program sequences according to example embodiments of the disclosed technology. FIG. 7C depicts exemplary components of the circuit 750. It should be appreciated that the circuit 750 may include other circuit components associated with programming a memory cell array that are not depicted in FIG. 7C. Further, in some embodiments, the memory circuit 750 may be a NAND flash device, while in other embodiments, the memory circuit 750 may be another type of memory device. Moreover, while example embodiments of the disclosed technology are described in connection with programming of SLC NAND flash, it should be appreciated that embodiments of the disclosed technology are applicable to and can be implemented in connection with other types of NAND flash (e.g., MLC, TLC, QLC, etc.) and/or other types of memory devices, more generally.

In example embodiments of the disclosed technology, the memory circuit 750 includes a data input buffer (DIN) 752. The circuit 750 may receive page data 754 via DIN 752. The page data 754 may be data to be written to a memory cell array 780. The page data 754 may be stored in a page buffer 756 prior to being transferred 758 to data latches 760, and ultimately programmed into the memory cell array 780. It should be appreciated that the data latches 760 associated with memory cell programming operations are distinct from the latching circuit 506 of FIG. 5, which is associated with sense/read operations. The memory circuit 750 further includes one or more charge pumps 770 (referred to and depicted in the singular for ease of explanation and depiction). The charge pump 770 may be configured to generate, based on an input current 762, high programming voltages 764 for programming memory cells of the memory cell array 780 with the page data 754.

In example embodiments, a user may enter a program command that includes the page data 754 to be programmed into the memory cell array 780. Referring, for example, to the fast SLC burst program sequence of FIG. 7A, the program command may be an initial program command 704. The initial program command 704 may be associated with page data 754, which may be stored in the page buffer 756. Responsive to receiving the initial program command 704, the charge pump 770 (also referred to herein as a voltage pump) may be charged up to a target level. In addition, the page data 754 may be transferred from the page buffer 756 to the internal data latches 760. Concurrently with transfer of the page data 754 from the page buffer 756 to the data latches 760 and charging up of the charge pump 770, the memory circuit 708 may wait for the page buffer 756 to be released to permit the next page data to be placed in the page buffer 756.

Then, after the charge pump 770 has been charged to the target level, a cell programming operation may begin, during which the charge pump 770 may generate a series of programming voltages 764 (pulses) to cause the data in the data latches 760 to be programmed into memory cells of the memory cell array 780. In example embodiments, during the programming operation, the next page data that is stored in the page buffer 756 may be moved into the latches 760. As previously noted, the burst program sequence of FIG. 7A hides the time associated with moving next page data from the page buffer 756 into the latches 760 in the programming time for programming current page data (i.e., page data that is in the latches 760) to the memory cell array 780. Similarly, the transfer of next page data from the page buffer 756 to the data latches 760 may occur concurrently with the programming of current page data for each subsequent program operation. In addition, as previously described, in the burst program sequence of FIG. 7A (and the alternative burst program sequence of FIG. 7B), the WL/BLs are not fully discharged and the charge pump 770 is not reset between program operations (as is the case with the cache program sequence of FIG. 6), but rather, full discharge of the WL/BLs and reset of the charge pump 770 occurs after all program operations have been performed. While the burst program sequence of FIG. 7A was used above to describe the operation of the memory circuit 750, it should be appreciated that the memory circuit 750 can also implement the alternative burst program sequence of FIG. 7B.

FIG. 8 depicts a performance comparison 800 of the fast SLC burst program sequences of FIGS. 7A and 7B according to example embodiments of the disclosed technology with the existing SLC cache program sequence of FIG. 6A. The performance comparison 800 shows the total program time for programming n pages of page data for each of the program sequences of FIGS. 6A, 7A, and 7B. As depicted in FIG. 8, the total program time savings achieved by the fast SLC burst program sequence of FIG. 7A and the alternative SLC burst program sequence of FIG. 7B, respectively, over the cache program sequence of FIG. 6A grows linearly with the number of pages.

In particular, the difference between the total program time of n pages using the cache program sequence of FIG. 6A (i.e., 62n+15 μs) and the total program time of n pages using the fast SLC burst program sequence of FIG. 7A (i.e., 47n+30 μs) is given by: (62n+15)−(47n+30)=(15n−15)=15 (n−1) μs. Thus, total program savings are achieved with the fast SLC burst program sequence of FIG. 7A over the cache program sequence of FIG. 6A as long the number of pages to be programmed is greater than 1, and the time savings that are achieved grow linearly with the number of pages. Along similar lines, the difference between the cache program sequence total program time (i.e., 62n+15 μs) and the total program time of n pages using the alternative fast SLC burst program sequence of FIG. 7B (i.e., 49.5n+30 μs) is given by: (62n+15)−(49.5n+30)=(12.5n−15) μs. Thus, as with the embodiment of FIG. 7A, the alternative fast SLC burst program sequence of FIG. 7B achieves total program time savings over the cache program sequence of FIG. 6A so long the as the number of pages to be programmed is greater than 1. Such time savings, however, are less than what the fast SLC burst program sequence of FIG. 7A can achieve. In particular, it is clear that the time savings of the alternative burst program sequence of FIG. 7B over the cache program sequence of FIG. 6 (i.e., 12.5n−15) is less than 15n−15 (the time savings of the burst program sequence of FIG. 7A as compared to the cache program sequence of FIG. 6A), for any n.

Figure 9A:
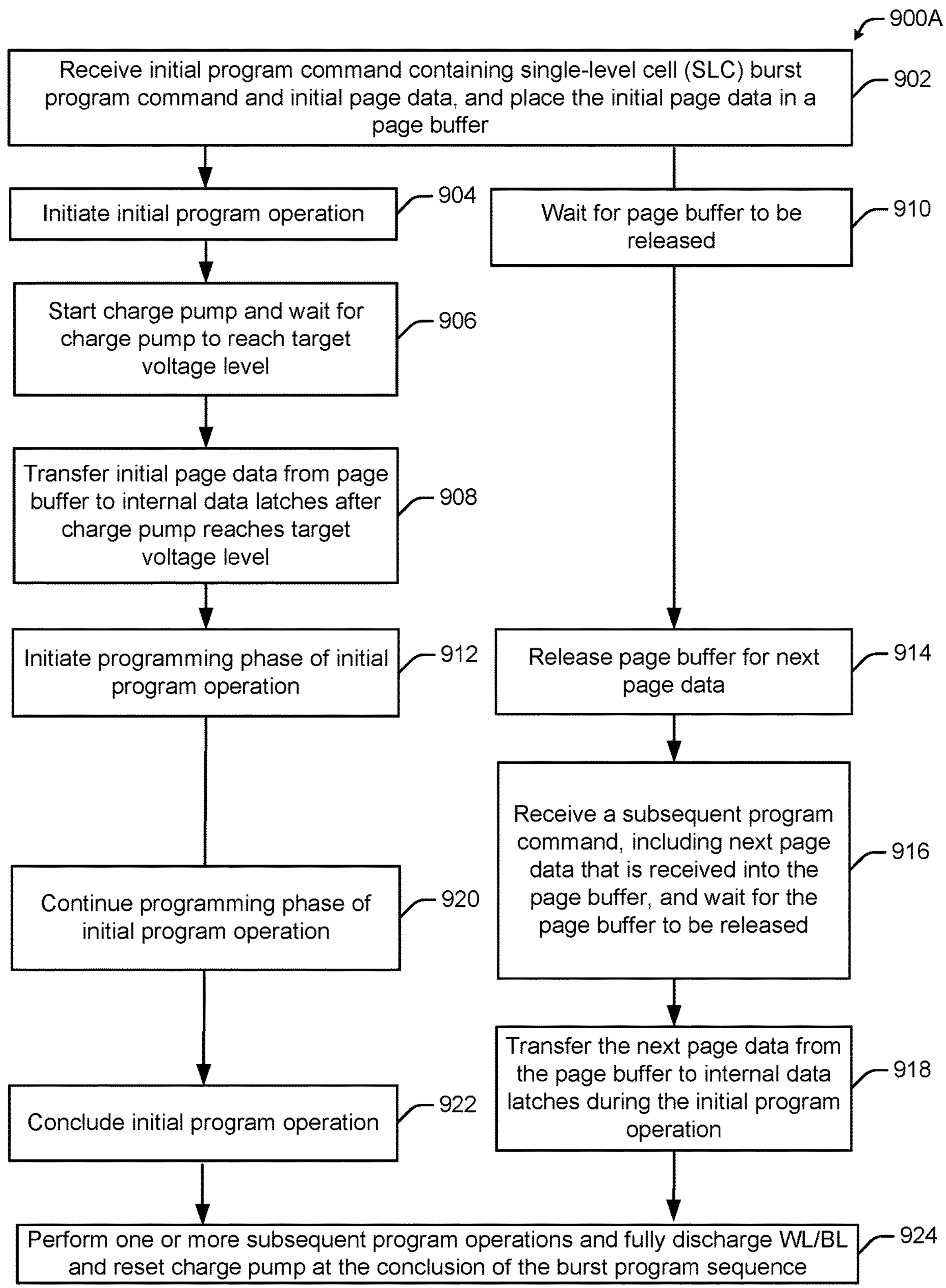
FIG. 9A is a flowchart of an illustrative method for implementing the fast SLC burst program sequence of FIG. 7A according to example embodiments of the disclosed technology.

FIG. 9A is a flowchart of an illustrative method 900A for implementing the fast SLC burst program sequence of FIG. 7A according to example embodiments of the disclosed technology. In some embodiments, the method 900*a* may be performed by the controller 122 (or equivalently functioned circuits), in combination with all or a subset of the other circuits depicted in FIG. 1, which can be considered a control circuit that performs the operations of method 900*a*. In some embodiments, the controller that performs the method 900*a* may be instructions that are hardwired or fused into the memory core (e.g., an embedded microcontroller). In other embodiments, the controller may be a separately provided controller (e.g., a DRAM) that interfaces with a memory device (e.g., a NAND device). Generally speaking, a controller (e.g., controller 122) may include any type of volatile or non-volatile memory system configured to interface with a memory device/circuit (e.g., a NAND device), or that is integrated therein. FIG. 9A will be described with reference to FIG. 7A hereinafter.

At block 902 of the method 900*a*, an initial program command 704 may be received. The initial program command 704 may include an SLC burst program command 706 that indicates that an SLC burst program sequence is to be initiated. The initial program command 704 may further include page data to be programmed into flash memory cells and address information indicative of memory locations of the cells to be programmed. Additionally, the initial program command 704 may include a cache program execution command that indicates that cache program functionality—according to which the transfer of next page data into the page buffer is hidden within the prior/current program operation—is to be implemented within the fast SLC burst program sequence.

At block 904 of the method 900*a*, an initial program operation 702 may be initiated. The initial program operation 702 may begin with an operation, at block 906, to charge a voltage pump to a target voltage level. Then, at block 908 of the method 900*a*, after the charge pump reaches the target voltage level, the initial page data entered into the page buffer as part of the initial program command 704 may be transferred to internal data latches. At least partially concurrently with the operations at blocks 904 and 906, a waiting period 708 may occur at block 910, during which a user may wait for the page buffer to be released so that next page data can be entered into the page buffer as part of a subsequent program command 710.

At block 912 of the method 900*a*, a programming phase of the initial program operation 702 may be initiated. As previously described, the programming phase may include charging up of the WL/BLs, programming flash memory cells with the page data, and ultimately partially discharging the WL/BLs after the flash memory cell programming is complete. At block 914 of the method 900*a*, concurrently with initiation of the programming phase of the initial program operation 702, or shortly thereafter, the page buffer may be released to allow for next page data to be entered into the page buffer. Then, at block 916 of the method 900*a*, a subsequent program command 710 may be received.

The subsequent program command 710 may include next page data received into the page buffer that was released. Upon receiving the next page data into the page buffer, another waiting period 712 to wait for release of the page buffer may be initiated. As previously described, release of the page buffer may occur responsive to transfer of page data from the page buffer into the internal data latches. It should be appreciated that receipt of the subsequent program command 710 at block 916 may occur concurrently with the programming phase of the initial program operation 702, which may continue to proceed at block 920 of the method 900*a*. As a result, the time to enter the next page data into the page buffer is hidden within the programming phase time of the ongoing initial program operation 702, and thus, does not contribute to the overall program time.

In addition, the next page data moved into the page buffer during the initial program operation 702 may also be transferred, at block 918 of method 900*a*, to the internal data latches during the initial program operation 702. More specifically, at block 918, the next page data may be transferred from the page buffer to the internal data latches during the partial WL/BL discharge portion of the programming phase of the initial program operation 702, which occurs after the cell programming is complete. In this manner, the time to transfer the next page data from the page buffer to the internal data latches is hidden within the programming phase time of the initial program operation 702, and thus, does not contribute to the overall program time—thereby providing a total program time savings over the cache program sequence of FIG. 6A. Then, at block 922 of the method 900*a*, the initial program operation 702 may conclude, which may occur concurrently with completion of the transfer of the next page data from the page buffer to the data latches, or shortly thereafter.

At block 924, the method 900*a* may proceed iteratively for one or more subsequent program operations 714. That is, during any given subsequent program operation 714, the next page data received as part of a next subsequent program command 710 and corresponding to a next subsequent program operation 714 to be performed may be both received into the released page buffer and transferred from the page buffer to the internal data latches. In this manner, both the time to enter the next page data into the page buffer and the time to transfer that page data to the internal data latches becomes hidden within the program time of the prior/current program operation 714. Finally, when there is no additional subsequent program operation 714, the operation 716 to fully discharge the WL/BLs and reset the charge pump may be performed, at block 924. Thus, as described earlier, the method 900*a*—which implements the fast SLC burst program sequence of FIG. 7A—provides total program time savings by hiding both the time to enter the next page data into the page buffer and the time to transfer that page data to the internal data latches within the program time of the prior/current program operation 714 as well as by performing only a single full WL/BL discharge and charge pump reset operation 916 at the end of the SLC burst program sequence.

Figure 9B:
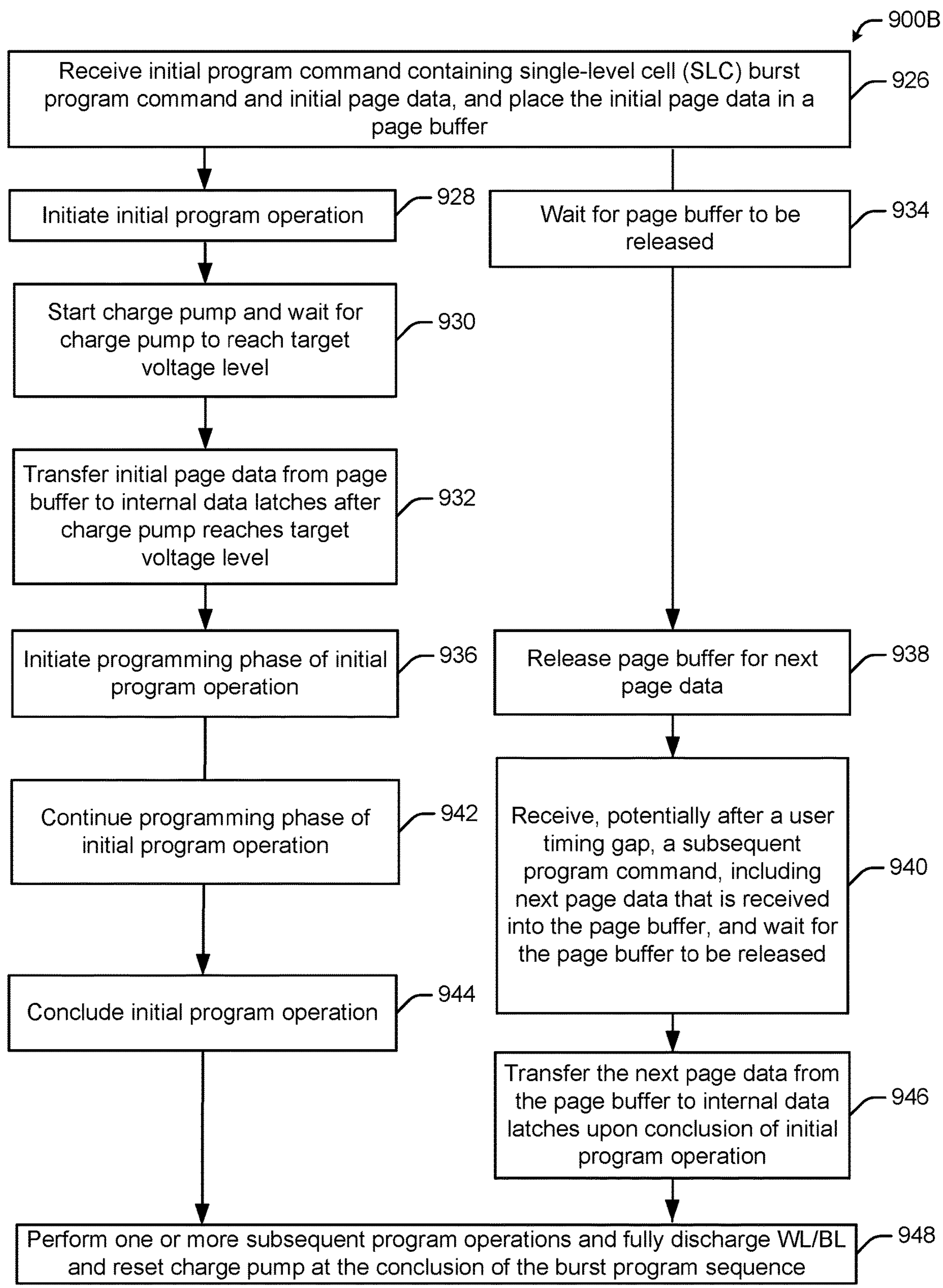
FIG. 9B is a flowchart of an illustrative method for implementing the fast SLC burst program sequence of FIG. 7B according to example embodiments of the disclosed technology.

FIG. 9B is a flowchart of an illustrative method 900B for implementing the alternative fast SLC burst program sequence of FIG. 7B according to example embodiments of the disclosed technology. Similar to the method 900*a*, the method 900*b* may be performed by the controller 122 (or equivalently functioned circuits), in combination with all or a subset of the other circuits depicted in FIG. 1, which can be considered a control circuit that performs the operations of method 900*b*. In some embodiments, the controller that performs the method 900*b* may be instructions that are hardwired or fused into the memory core (e.g., an embedded microcontroller). In other embodiments, the controller may be a separately provided controller (e.g., a DRAM) that interfaces with a memory device (e.g., a NAND device). FIG. 9B will be described with reference to FIG. 7B hereinafter. Certain operations of the method 900*b* may be the same as or similar to corresponding operations of the method 900*a*. The method 900*b* may, however, differ from the method 900*a* with respect to when the next page data associated with a next program command/operation is transferred from the page buffer to the internal data latches, for example.

At block 926 of the method 900*b*, an initial program command 720 may be received. The initial program command 720 may include an SLC burst program command that indicates that an SLC burst program sequence is to be initiated. The initial program command 720 may further include page data to be programmed into flash memory cells and address information indicative of memory locations of the cells to be programmed. Additionally, the initial program command 720 may include a cache program execution command that indicates that cache program functionality—according to which the transfer of next page data into the page buffer is hidden within the prior/current program operation—is to be implemented within the fast SLC burst program sequence.

At block 928 of the method 900*b*, an initial program operation 724 may be initiated. The initial program operation 724 may begin with an operation, at block 930, to charge a voltage pump to a target voltage level. Then, at block 932 of the method 900*b*, after the charge pump reaches the target voltage level, the initial page data entered into the page buffer as part of the initial program command 720 may be transferred to internal data latches. At least partially concurrently with the operations at blocks 930 and 932, a waiting period may occur at block 934, during which a user may wait for the page buffer to be released so that next page data can be entered into the page buffer as part of a subsequent program command 722.

At block 936 of the method 900*b*, a programming phase of the initial program operation 724 may be initiated. As previously described, the programming phase may include charging up of the WL/BLs, programming flash memory cells with the page data, and ultimately partially discharging the WL/BLs after the flash memory cell programming is complete. At block 938 of the method 900*b*, concurrently with initiation of the programming phase of the initial program operation 724, or shortly thereafter, the page buffer may be released to allow for next page data to be entered into the page buffer. Then, at block 940 of the method 900*b*, a subsequent program command 722 may be received.

The subsequent program command 722 may include next page data that is received into the released page buffer. In the example implementation of the alternative fast SLC burst program sequence illustrated in FIG. 9B, the subsequent program command 722 may be received after a user timing gap, which may be provided based on user requirements, for example. Upon receiving the next page data into the page buffer, another waiting period to wait for release of the page buffer may be initiated. As previously described, release of the page buffer may occur responsive to transfer of page data from the page buffer into the internal data latches. It should be appreciated that receipt of the subsequent program command 722 at block 940 may occur concurrently with the programming phase of the initial program operation 724, which may continue to proceed at block 942 of the method 900*b*. As a result, and similar to the both the fast SLC burst program sequence of FIG. 7A and cache program sequence of FIG. 6A, the time to enter the next page data into the page buffer is hidden within the programming phase time of the ongoing initial program operation 724, and thus, does not contribute to the overall program time.

At block 944 of the method 900*b*, the initial program operation 724 may conclude. Thereafter, the next page data in the page buffer may be transferred to the internal data latches at block 946 of method 900*b*. In particular, because, for example, the user is unable to guarantee that the next page data can be transferred to the internal data latches within the partial WL/BL discharge portion of the programming phase of the initial program operation 724, the next page data is transferred at block 946 after the initial program operation 724 is complete, rather than during the initial program operation 724, as is the case with the fast SLC burst program sequence of FIG. 7A. As such, contrary to the burst program sequence of FIG. 7A, the time to transfer the next page data from the page buffer to the internal data latches is not hidden within the programming phase time of the initial program operation 724 in the alternative burst program sequence of FIG. 7B, and thus, does contribute to the overall program time. Thus, the alternative burst program sequence of FIG. 7B does not provide this additional total program time savings of the burst program sequence of FIG. 7A, but still provides total program time savings over the cache program sequence of FIG. 6A by virtue of not performing the full WL/BL discharge and pump reset operation 730 at the end of each program operation.

At block 948, the method 900*b* may proceed iteratively for one or more subsequent program operations 726. That is, during any given subsequent program operation 726, the next page data corresponding to the next program operation may be received into the released page buffer (as part of receipt of a next program command 722), but may only be transferred from the page buffer to the internal data latches responsive to the prior/current program operation concluding. In this manner, the time to enter the next page data into the page buffer, but not the time to transfer that page data to the internal data latches, becomes hidden within the program time of the prior/current program operation 726. Finally, when there is no additional subsequent program command 722, and thus, no additional subsequent operation 726 to be performed, the operation 730 to fully discharge the WL/BLs and reset the charge pump may be performed, at block 948. Thus, as described earlier, the method 900*b*—which implements the alternative fast SLC burst program sequence of FIG. 7B—provides total program time savings over the cache program sequence of FIG. 6A by performing only a single full WL/BL discharge and charge pump reset operation 930 at the end of the alternative SLC burst program sequence.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In an embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in an embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A method of burst programming a memory array of a memory system, the method comprising:
- receiving a first program command, wherein receiving the first program command comprises receiving first page data into a page buffer;
- determining that the first program command comprises a burst program command code indicating that a burst program sequence is to be initiated;
- initiating a first program operation of the burst program sequence, the first program operation corresponding to the first program command;
- receiving a second program command during the first program operation, wherein receiving the second program command comprises receiving second page data into the page buffer; and
- transferring the second page data into one or more data latches during the first program operation.

2. The method of claim 1, wherein transferring the second page data into the one or more data latches during the first program operation comprises transferring the second page data during a programming phase of the first program operation.

3. The method of claim 2, wherein transferring the second page data during the programming phase of the first program operation comprises transferring the second page data during a partial wordline/bitline (WL/BL) discharge operation of the programming phase of the first program operation.

4. The method of claim 2, wherein the first program operation is an initial program operation, and wherein the initial program operation comprises, prior to the programming phase, a first operation to charge a charge pump to a target voltage level and a second operation to transfer the first page data into the page buffer.

5. The method of claim 1, further comprising:
- initiating a second program operation of the burst program sequence corresponding to the second program command responsive to or concurrently with the initial program operation concluding.

6. The method of claim 5, wherein the first program operation is an initial program operation comprising a charging operation to charge a charge pump to a target voltage level, and wherein the second program operation does not include the charging operation due to the charge pump not being reset during the initial program operation.

7. The method of claim 6, wherein the burst program sequence further comprises a plurality of additional program operations subsequent to the second program operation, and wherein each of the plurality of additional program operations does not include the charging operation.

8. The method of claim 7, wherein the plurality of additional program operations comprises a final program operation of the burst program sequence, the method further comprising:
- fully discharging the wordlines/bitlines (WLs/BLs) and resetting the charge pump responsive to the final program operation concluding.

9. The method of claim 7, further comprising for each additional program operation other than a final program operation:
- receiving a next program command during the additional program operation, wherein receiving the next program command comprises receiving next page data into the page buffer; and
- transferring the next page data into the one or more data latches during the additional program operation.

10. A memory circuit, comprising:
- a memory array comprising a plurality of programmable memory cells;
- a plurality of wordlines (WLs);
- a plurality of bitlines (BLs);
- a page buffer configured to receive and store page data;
- one or more data latches; and
- one or more charge pumps,
- wherein the one or more charge pumps are charged to one or more target voltage levels responsive to receipt of a first program command associated with first page data, and
- wherein the one or more charge pumps are configured to maintained a charged state during a transition from a first program operation during which the first page data is programmed into the memory array to a second program operation during which second page data associated with a second program command is programmed into the memory array, the second program operation occurring subsequent to the first program operation.

11. The memory circuit of claim 10, wherein the first page data is received into the page buffer in association with receipt of the first program command, wherein the second page data is received into the page buffer during the first program operation in association with receipt of the second program command, and wherein the second page data is transferred into the one or more data latches during the first program operation.

12. The memory circuit of claim 11, wherein the second page data is transferred into the one or more data latches during the first program operation by transferring the second page data during a partial discharge of one or more of the plurality of WLs and one or more of the plurality of BLs that occurs during a programming phase of the first program operation.

13. The memory circuit of claim 12, wherein the one or more charge pumps are charged to the one or more target voltage levels as part of a charging operation that occurs during the first program operation, and wherein the second program operation does not include the charging operation due to the one or more of the plurality of WLs and the one or more of the plurality of BLs not being fully discharged during the first program operation.

14. The memory circuit of claim 13, wherein the first program operation and the second program operation are part of a burst program sequence that further comprises a plurality of additional program operations subsequent to the second program operation, and wherein each of the plurality of additional program operations does not include the charging operation.

15. The memory circuit of claim 14, wherein the plurality of additional program operations comprises a final program operation of the burst program sequence, and wherein the one or more of the plurality of WLs and the one or more of the plurality of BLs are fully discharged and the one or more charge pumps are reset responsive to the final program operation concluding.

16. The memory circuit of claim 14, wherein, for each additional program operation of the burst program sequence other than a final program operation, next page data associated with a next program command is received into the page buffer during the additional program operation and the next page data is transferred into the one or more data latches during the additional program operation.

17. The memory circuit of claim 10, further comprising a controller configured to:

determine that the first program command comprises a burst program command code indicating that a burst program sequence is to be initiated; and initiate the burst program sequence, wherein the burst program sequence comprises the first program operation and the second program operation.

18. A method of burst programming a memory array of a memory system, the method comprising:

receiving a first program command, wherein receiving the first program command comprises receiving first page data into a page buffer;

determining that the first program command comprises a burst program command code indicating that a burst program sequence is to be initiated;

initiating a first program operation of the burst program sequence, the first program operation corresponding to the first program command;

receiving a second program command during the first program operation, wherein receiving the second program command comprises receiving second page data into the page buffer; and transferring the second page data into one or more data latches subsequent to the first program operation concluding.

19. The method of claim 18, wherein receiving a second program command during the first program operation comprises receiving the second program command after a user timing gap has elapsed since the first program operation was initiated.

20. The method of claim 18, further comprising:

determining that a user guarantee has not been provided that the second page data can be transferred prior to completion of a partial wordline/bitline (WL/BL) discharge operation of a programming phase of the first program operation, wherein the second page data is transferred to the one or more data latches subsequent to the first program operation concluding responsive to determining that the user guarantee has not been provided.

* * * * *